US012772682B2

(12) United States Patent
Lee et al.

(10) Patent No.: US 12,772,682 B2
(45) Date of Patent: Oct. 20, 2026

(54) DISPLAY APPARATUS

(71) Applicant: Samsung Display Co., LTD., Yongin-si (KR)

(72) Inventors: Jiwon Lee, Yongin-si (KR); Hyelan Kim, Yongin-si (KR); Jangyeol Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 302 days.

(21) Appl. No.: 18/378,300

(22) Filed: Oct. 10, 2023

(65) Prior Publication Data

US 2024/0130181 A1 Apr. 18, 2024

(30) Foreign Application Priority Data

Oct. 18, 2022 (KR) ........................ 10-2022-0134450

(51) Int. Cl.
*H10K 59/131* (2023.01)
*H10K 59/80* (2023.01)
*H10K 77/10* (2023.01)

(52) U.S. Cl.
CPC ......... *H10K 59/131* (2023.02); *H10K 59/873* (2023.02); *H10K 77/111* (2023.02)

(58) Field of Classification Search
None
See application file for complete search history.

(56) References Cited

U.S. PATENT DOCUMENTS

2018/0095574 A1* 4/2018 Kim ...................... G06F 3/0446
2021/0097902 A1 4/2021 Hong et al.

FOREIGN PATENT DOCUMENTS

| | | | |
|---|---|---|---|
| CN | 110992832 | A | 4/2020 |
| CN | 111653206 | A | 9/2020 |
| CN | 112614431 | A | 4/2021 |
| KR | 20180036833 | A | 4/2018 |
| KR | 1020190101646 | A | 9/2019 |
| KR | 102111848 | B1 | 5/2020 |

OTHER PUBLICATIONS

Brian J. Melde et al., "Silica Nanostructures Templated by Oriented Block Copolymer Thin Films Using Pore-Filling and Selective-Mineralization Routes", Chem. Mater. 2005, 17, 4743-4749.
Jong-Yoon Ha et al., "Patterned Growth of TiO2 Nanowires on Titanium Substrates", Applied Physics Express 4 (2011) 065002, DOI: 10.1143/APEX.4.065002.

(Continued)

*Primary Examiner* — Bo B Jang
(74) *Attorney, Agent, or Firm* — CANTOR COLBURN LLP

(57) ABSTRACT

A display apparatus includes a first member, a display panel disposed on the first member and including a plurality of display areas arranged to be apart from each other and a bridge area connecting together the display areas apart from each other, a support member disposed on the first member to correspond to each of the display areas and a portion of the bridge area, and a stopper unit disposed on the first member, where the stopper unit selectively contacts with the support member.

34 Claims, 52 Drawing Sheets

(56) References Cited

OTHER PUBLICATIONS

Kai Chen et al., "Selective patterned growth of ZnO nanowires/ nanosheets and their photoluminescence properties", Feb. 2015 | vol. 5, No. 2 | DOI:10.1364/OME.5.000353 | Optical Materials Express 353.
Katharina Brassat et al., "Understanding Film Thickness-Dependent Block Copolymer Self-Assembly by Controlled Polymer Dewetting onPrepatterned Surfaces", Adv. Mater. Interfaces 2020, 7, 1901605.
Peijiang Liu et al., "A general and robust strategy for in-situ templated synthesis of patterned inorganic nanoparticle assemblies", Elsevier Ltd, Giant, 8, 2021, 100076.

* cited by examiner

DISPLAY APPARATUS

This application claims priority to Korean Patent Application No. 10-2022-0134450, filed on Oct. 18, 2022, and all the benefits accruing therefrom under 35 U.S.C. § 119, the content of which in its entirety is herein incorporated by reference.

BACKGROUND

1. Field

One or more embodiments relate to an apparatus, and more particularly, to a display apparatus.

2. Description of the Related Art

As the display technology for visually expressing various types of electrical signal information develops rapidly, various flat panel display apparatuses having desired characteristics, such as a slim profile, a light weight, and low power consumption, have been introduced. Recently, along with the development of display-related technology, flexible display apparatuses that are foldable or rollable have been studied and developed. Furthermore, research and development for stretchable display apparatuses that can be changed into various shapes are being actively conducted.

SUMMARY

Generally, a display apparatus may be arranged on a surface of an object having various shapes or may be maintained in various shapes. In this case, display areas of a display panel may be apart from each other, and when the display panel is deformed to correspond to the surface of the object, a distance between the display areas that are apart from each other may vary. In an embodiment, each of the display areas may rotate and be displaced from its initially arranged position, and thus an image may be distorted.

One or more embodiments include a display apparatus capable of implementing a clear image by reducing displacement of each display area.

According to one or more embodiments, a display apparatus includes a first member, a display panel disposed on the first member and including a plurality of display areas arranged to be apart from each other and a bridge area connecting together the display areas apart from each other, a support member disposed on the first member to correspond to each of the display areas and a portion of the bridge area, and a stopper unit disposed on the first member, where the stopper unit selectively contacts with the support member.

In an embodiment, at least a portion of the stopper unit may be bent.

In an embodiment, the support member and the stopper unit may include a same material as each other.

In an embodiment, the support member may include a body portion arranged to correspond to the display area and a protrusion portion protruding from the body portion.

In an embodiment, the stopper unit may selectively contact with the protrusion portion.

In an embodiment, the stopper unit may include a first stopper unit and a second stopper unit arranged to be apart from the first stopper unit and arranged in a direction opposite to the first stopper unit with respect to a center of the display area.

In an embodiment, the display apparatus may further include a first adhesive member arranged between the first member and the support member and between the first member and the stopper unit.

In an embodiment, the display apparatus may further include a second member disposed on the display panel.

In an embodiment, the display apparatus may further include a second adhesive member arranged between the second member and the display panel and disposed to correspond to each of the display areas and the bridge area.

In an embodiment, the display apparatus may further include a force applicator protruding from the second adhesive member and being in contact with the bridge area. In an embodiment, the second member may include a heat-shrinkable film.

In an embodiment, the first member and the second member may include a same material as each other, and a thickness of the first member may be greater than a thickness of the second member.

In an embodiment, the first member may include a heat-shrinkable film.

According to one or more embodiments, a display apparatus includes a first member, a display panel disposed on the first member and including a plurality of display areas arranged to be apart from each other and a bridge area connecting together the display areas apart from each other, a support member disposed on the first member to correspond to each of the display areas and a portion of the bridge area, a second member disposed on the display panel, a second adhesive member arranged between the second member and the display panel and having a planar shape corresponding to a planar shape of each of the display areas and a planar shape of the bridge area, and a force applicator protruding from the second adhesive member to the bridge area and being in contact with the bridge area.

In an embodiment, the force applicator may be in contact with a center of the bridge area.

In an embodiment, the force applicator may apply a force to the bridge area toward the first member when display areas adjacent to each other among the display areas come closer to each other.

In an embodiment, the support member may include a body portion arranged to correspond to the display area and a protrusion portion protruding from the body portion.

In an embodiment, the first member and the second member may include a same material as each other.

In an embodiment, at least one selected from the first member and the second member may include a heat-shrinkable film.

In an embodiment, a thickness of the first member and a thickness of the second member may be different from each other.

In an embodiment, the display apparatus may further include a first adhesive member arranged between the first member and the support member.

In an embodiment, the display apparatus may further include a second adhesive member arranged between the second member and the display panel and disposed to correspond to each of the display areas and the bridge area.

According to one or more embodiments, a display apparatus includes a first member, a display panel disposed on the first member and including a plurality of display areas arranged to be apart from each other and a bridge area connecting together the display areas apart from each other, a support member disposed on the first member to correspond to each of the display areas and a portion of the bridge area, and a first adhesive member arranged between the first member and the support member and including an island area arranged to overlap at least a portion of the support member in a plan view and having a modulus of elasticity different from a modulus of elasticity of an area excluding the island area of the first adhesive member.

In an embodiment, the island area may include a first island area corresponding to the display area and a second island area protruding from the first island area and overlapping at least a portion of the bridge area.

In an embodiment, a length of the second island area may be smaller than a length of the bridge area in a plan view.

In an embodiment, the second island area may include a plurality of second island areas, and one of the plurality of second island areas and another one of the plurality of second island areas may protrude from the first island area in different directions from each other.

In an embodiment, the support member may be arranged inside the island area.

In an embodiment, an adhesion of the island area may be greater than or equal to about 3,000 gram-force per inch (g·f/inch).

In an embodiment, an adhesion of the island area may be greater than an adhesion of the area of the first adhesive member excluding the island area.

In an embodiment, the first adhesive member may further include a core portion arranged in the island area.

In an embodiment, the display apparatus may further include a second member disposed on the display panel.

In an embodiment, a thickness of the first member and a thickness of the second member may be different from each other.

In an embodiment, the first member and the second member may include a same material as each other.

In an embodiment, the display apparatus may further include a second adhesive member arranged between the second member and the display panel and formed to correspond to each of the display areas and at least a portion of the bridge area.

In an embodiment, the first member may include a heat-shrinkable film.

Features of embodiments of the invention other than those described above will become apparent from the drawings, claims, and detailed description of the disclosure.

BRIEF DESCRIPTION OF THE DRAWINGS

The above and other features of certain embodiments of the disclosure will be more apparent from the following description taken in conjunction with the accompanying drawings, in which:

FIGS. 12O and 12P are cross-sectional views showing a manufacturing procedure for manufacturing a portion of the display apparatus of FIG. 11B;

DETAILED DESCRIPTION

Figure 1:
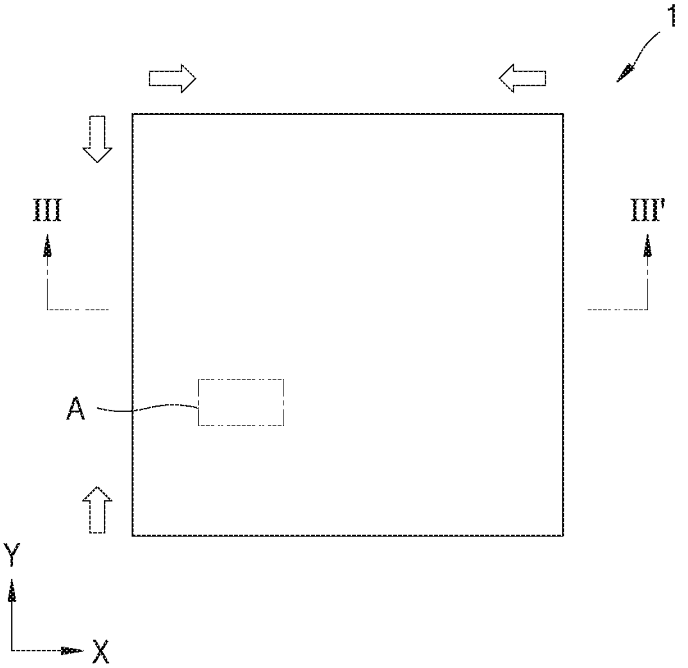
FIG. 1 is a schematic plan view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof.

Various modifications may be applied to embodiments of the invention, and particular embodiments of the disclosure will be illustrated in the drawings and described in the detailed description section. The effect and features of the embodiments of the invention, and a method to achieve the same, will be clearer referring to the detailed descriptions below with the drawings. However, the disclosure may be implemented in various forms, not by being limited to the embodiments presented below.

It will be understood that, although the terms "first," "second," "third" etc. may be used herein to describe various elements, components, areas, layers and/or sections, these elements, components, areas, layers and/or sections should not be limited by these terms. These terms are only used to distinguish one element, component, area, layer or section from another element, component, area, layer or section. Thus, a first element, component, area, layer or section discussed below could be termed a second element, component, area, layer or section without departing from the teachings herein.

In the following embodiment, the expression of singularity in the specification includes the expression of plurality unless clearly specified otherwise in context.

In the following embodiment, it will be further understood that the terms "comprises" and/or "comprising" or "includes" and/or "including" when used herein specify the presence of stated features or components, but do not preclude the presence or addition of one or more other features or components.

In the following embodiment, it will be understood that when a layer, area, or component is referred to as being "on" another layer, area, or component, it can be directly or indirectly formed on the other layer, area, or component. That is, for example, intervening layers, areas, or components may be present. In contrast, when an element is referred to as being "directly on" another element, there are no intervening elements present.

Sizes of components in the drawings may be exaggerated or reduced for convenience of explanation. In other words, since sizes (for example, thicknesses) of components in the drawings are arbitrarily illustrated for convenience of explanation, the following embodiments are not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the following embodiment, the X-axis, the Y-axis, and the Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of areas as illustrated herein but are to include deviations in shapes that result, for example, from manufacturing. For example, an area illustrated or described as flat may, typically, have rough and/or nonlinear features. Moreover, sharp angles that are illustrated may be rounded. Thus, the areas illustrated in the figures are schematic in nature and their shapes are not intended to illustrate the precise shape of an area and are not intended to limit the scope of the present claims.

Hereinafter, embodiments of the disclosure will be described in detail with reference to the accompanying drawings, and in the description with reference to the drawings, the same or corresponding components are indicated by the same reference numerals and any repetitive detailed descriptions thereof will be omitted or simplified.

FIG. 1 is a schematic plan view of a display apparatus according to an embodiment.

Referring to FIG. 1, an embodiment of a display apparatus 1 may be changed (or deformable) into various shapes. In such an embodiment, the display apparatus 1 may have a three-dimensional shape by applying heat while being disposed on an outer surface of a separate object in a flat state, or by applying heat after being arranged in a mold.

The display apparatus 1 may be a transparent display apparatus and may display an image on one surface thereof, and a user may visually recognize an object or scenery behind the display apparatus 1. In another embodiment, the display apparatus 1 may be an opaque display apparatus and may display an image on one surface.

The display apparatus 1 may be used in various fields. In an embodiment, for example, the display apparatus 1 may be a screen of a virtual reality (VR) device or a screen of an augmented reality (AR) device. In such an embodiment, the display apparatus 1 may have a curved outer surface. In another embodiment, the display apparatus 1 may be a face shield window of a helmet. In another embodiment, the display apparatus 1 may be attached onto a surface of an object, such as a vase having a curved surface. In another embodiment, the display apparatus 1 may also be attached to a structure, such as vehicle glass, windows, dashboards of vehicles, or outer walls of buildings.

The display apparatus 1 is not limited thereto, and a display apparatus having a three-dimensional shape may be attached to an outer surface of various objects having various shapes or may be used in fields where the display apparatus is desired.

The display apparatus 1 may contract in various directions. In an embodiment, for example, the display apparatus 1 may contract in at least one selected from a first direction (for example, one of an X-axis direction and a Y-axis direction of FIG. 1) and a second direction (for example, the other one of the X-axis direction and the Y-axis direction of FIG. 1). The display apparatus 1 may have a three-dimensional shape via such a movement or contraction.

Figure 2A:
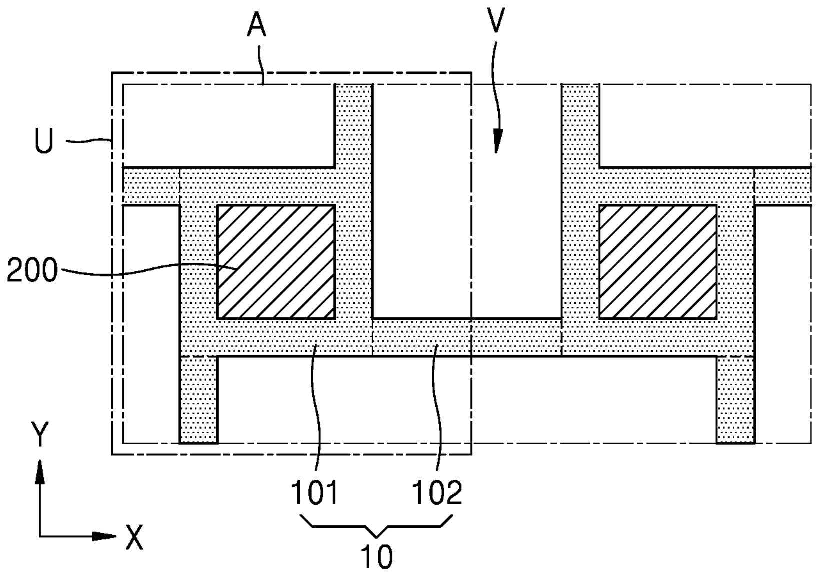
FIG. 2A is an enlarged plan view of portion A of FIG. 1 according to an embodiment.

FIG. 2A is an enlarged plan view of portion A of FIG. 1 according to an embodiment.

Referring to FIG. 2A, an embodiment of a display panel 10 of the display apparatus 1 may include a plurality of display areas 101 apart from each other, a plurality of bridge areas 102 connecting the plurality of display areas 101 together (or to each other), and a plurality of through portions V arranged between the plurality of bridge areas 102 and the plurality of display areas 101 and defined through the display panel 10.

The plurality of display areas 101 may be arranged apart from each other. In an embodiment, for example, the plurality of display areas 101 may be repeatedly arranged in a first direction (X-axis direction) and a second direction (Y-axis direction) different from the first direction (X-axis direction) to form a plane lattice pattern. In an embodiment, for example, the first direction (X-axis direction) and the second direction (Y-axis direction) may be perpendicular to each other. In another embodiment, for example, the first direction (X-axis direction) and the second direction (Y-axis direction) may form an obtuse angle or an acute angle.

A plurality of unit display units 200 may be disposed in the plurality of display areas 101, respectively. Each of the unit display units 200 may include at least one display element to emit visible light.

The plurality of bridge areas 102 may connect the plurality of display areas 101 together. In detail, four bridge areas 102 are connected to each of the plurality of display areas 101, and four bridge areas 102 connected to one display area 101 extend in different directions from each other and are arranged adjacent to the one display area 101, so that the four bridge areas 102 may be connected to other display areas 101 surrounding the one display area 101, respectively. At least some of the plurality of display areas 101 and the plurality of bridge areas 102 may be continuously formed with a same material. The plurality of display areas 101 and the plurality of bridge areas 102 may be integrally formed with each other as a unitary and indivisible part. Each of the through portions V may be arranged between the display areas 101 and the bridge areas 102.

The through portions V are formed through the display panel 10. The through portion V may provide a separation area between the plurality of display areas 101, reduce a weight of the display panel 10, and improve flexibility of the display panel 10. In addition, when the display panel 10 is bent, curved, or rolled, a shape of the through portions V is deformed, thereby effectively reducing occurrence of stress during the deformation of the display panel 10. Thus, abnormal deformation of the display panel 10 may be effectively prevented, and durability of the display panel 10 may be improved. Accordingly, a user's convenience during the use of the display apparatus 1 may be improved, and in particular, the display apparatus 1 may be easily applied to a wearable apparatus.

The through portion V may be formed by removing one area of a substrate of the display panel 10 by using a method, such as etching, or alternatively, when a substrate of the display panel 10 is manufactured, the substrate may be formed to include the through portion V. A process of forming the through portion V in the display panel 10 may be variously modified, and a method of manufacturing the display panel 10 is not particularly limited.

Hereinafter, a unit U (shown in FIG. 2B), which refers to a basic unit forming the display panel 10, is set, and a structure of the display panel 10 will be described in more detail based on the unit U.

The unit U may be repeatedly arranged in the first direction (X-axis direction) and the second direction (Y-axis direction). In other words, it will be understood that the display panel 10 is formed by a coupling of a plurality of units U that are repeatedly arranged in the first direction (X-axis direction) and the second direction (Y-axis direction). The unit U may include the display area 101 and at least one bridge area 102 connected to the display area 101. Four bridge areas 102 may be connected to one display area 101.

In an embodiment, the display areas 101 of two units U adjacent to each other may be apart from each other, and the bridge areas 102 of two units U adjacent to each other may be connected to each other. In such an embodiment, each of the bridge areas 102 included in the unit U may refer to a partial area of the bridge area 102 located in an area of the unit U, or may refer to the bridge area 102 as a whole, which is arranged between two neighboring display areas 101 and connects the two display areas 101 together.

The through portion V, which is an empty space, may be arranged (defined or formed) between the plurality of units U.

Among the plurality of units U, two units U adjacent to each other may be symmetric with each other. In detail, as shown in FIG. 2A, one unit U may be symmetric with another unit U arranged adjacent thereto in the first direction (X-axis direction) with respect to an axis of symmetry parallel to the second direction (Y-axis direction).

Figure 2B:
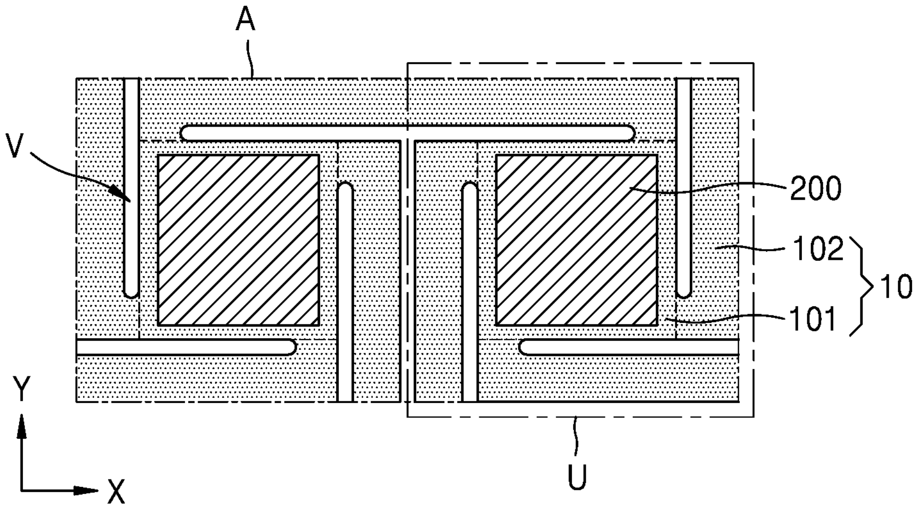
FIG. 2B is an enlarged plan view of portion A of FIG. 1 according to another embodiment.

FIG. 2B is an enlarged plan view of portion A of FIG. 1 according to another embodiment.

Referring to FIG. 2B, another embodiment of the display panel 10 of the display apparatus 1 may include the display area 101 and the bridge area 102. In such an embodiment, the display area 101 and the bridge area 102 are the same as or similar to those described with reference to FIG. 2A, and thus any repetitive detailed descriptions thereof will be omitted.

The bridge area 102 may connect together the display areas 101 adjacent to each other. In such an embodiment, unlike FIG. 2A, the bridge area 102 may be arranged parallel to one side of the display area 101. In such an embodiment, the through portion V may be arranged between each of the bridge areas 102 and the display area 101.

Figure 3:
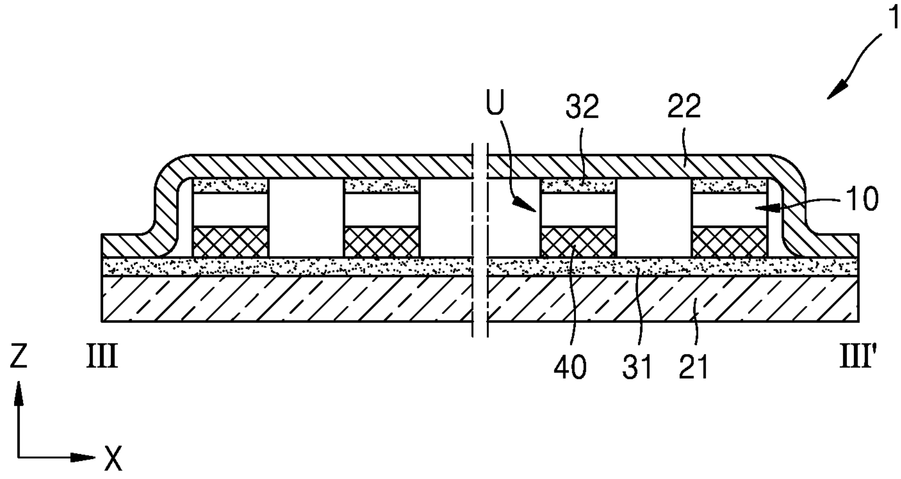
FIG. 3 is a cross-sectional view of the display apparatus taken along line of FIG. 1.

FIG. 3 is a cross-sectional view of the display apparatus 1 taken along line III-III' of FIG. 1.

Referring to FIG. 3, the display apparatus 1 may include a first member 21, a first adhesive member 31, a support member 40, the display panel 10, a second adhesive member 32, a second member 22, and a stopper unit (not shown).

The first member 21 may include a heat-shrinkable film. In an embodiment, for example, the first member 21 may include polyvinyl chloride (PVC), polypropylene (PP), and/or polyethylene terephthalate (PET). The first adhesive member 31 may be disposed on the first member 21. In an embodiment, the first adhesive member 31 may include a pressure sensitive adhesive (PSA) and/or an optically clear adhesive (OCA).

The first member 21 and the first adhesive member 31 may be disposed on an entire surface of the display apparatus 1. In an embodiment, the first member 21 and the first adhesive member 31 may be arranged not only in a region where the support member 40 is arranged but also in a region where the support member 40 is not arranged.

The support member 40 may be disposed on the first adhesive member 31. In an embodiment, the support member 40 may be patterned. In an embodiment, for example, support members 40 may be disposed on the first adhesive member 31 to be apart from each other. The support member 40 may be disposed below the display panel 10 to support the display panel 10. The support member 40 may include a photoresist (for example, a dry film photoresist).

The display panel 10 may include the unit U having a shape as shown in FIG. 2A or 2B. In such an embodiment, the unit U may be connected to the unit U adjacent thereto.

The unit U may be supported by the support member 40. In an embodiment, the support member 40 may overlap a portion of the unit U in a plan view.

The second adhesive member 32 may be disposed on the display panel 10. In an embodiment, the second adhesive member 32 may include a material the same as or similar to that of the first adhesive member 31. The second adhesive member 32 may be formed in a pattern shape. In an embodiment, for example, the second adhesive member 32 may overlap the support member 40 and/or the display panel 10 when viewed in a plan view or in the Z-axis direction (or a thickness direction). In such an embodiment, a planar shape of the second adhesive member 32 may be the same or similar to a planar shape of the support member 40 and/or a planar shape of the display panel 10. Hereinafter, for convenience of description, embodiments where a planar shape of the second adhesive member 32 and a planar shape of the display panel 10 are the same as each other will be described in detail. In an embodiment, the second adhesive member 32 may be disposed to correspond to each of the plurality of display areas 101 and the bridge area 102.

The second member 22 may be arranged to face the first member 21. In an embodiment, when the first member 21 and the second member 22 are viewed in a plan view, an edge portion of the first member 21 and an edge portion of the second member 22 may be coupled to each other by the first adhesive member 31 and/or the second adhesive member 32. Similarly to the first member 21, the second member 22 may be disposed on an entire surface of the display apparatus 1. In addition, the second member 22 may include a material the same as or similar to that of the first member 21. In an embodiment, the second member 22 may comprise a heat-shrinkable film. In an embodiment, the second member 22 may be disposed on the second adhesive member 32.

In an embodiment, a thickness of the first member 21 may be different from a thickness of the second member 22. In detail, a thickness of the second member 22 may be less than a thickness of the first member 21. If a thickness of the second member 22 is greater than or equal to a thickness of the first member 21, when the display apparatus 1 contracts, the contraction may not occur to correspond to an outer surface of a mold.

The stopper unit may be disposed on the first adhesive member 31. In an embodiment, the stopper unit may include a material the same as or similar to that of the support member 40. The stopper unit may prevent the support member 40 from rotating in one direction when at least one of the first member 21 and the second member 22 contracts. In an embodiment, at least one stopper unit may be provided. In addition, when the support member 40 rotates, the stopper unit may be in contact with at least a portion of the support member 40 or may be apart from at least a portion of the support member 40, which will be described in detail below. In an embodiment, the stopper unit may selectively contact with the support member 40.

Figure 4A:
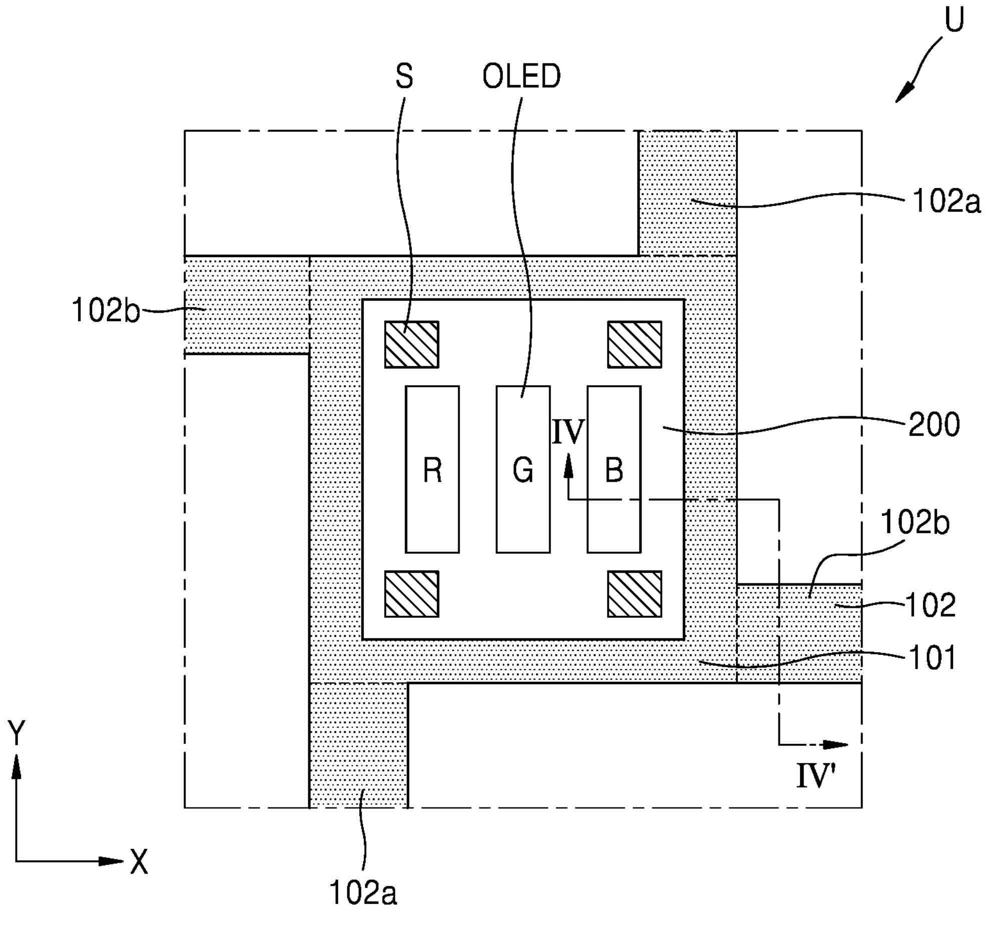
FIGS. 4A and 4B are schematic plan views of a unit display unit of FIG. 1.
Figure 4B:
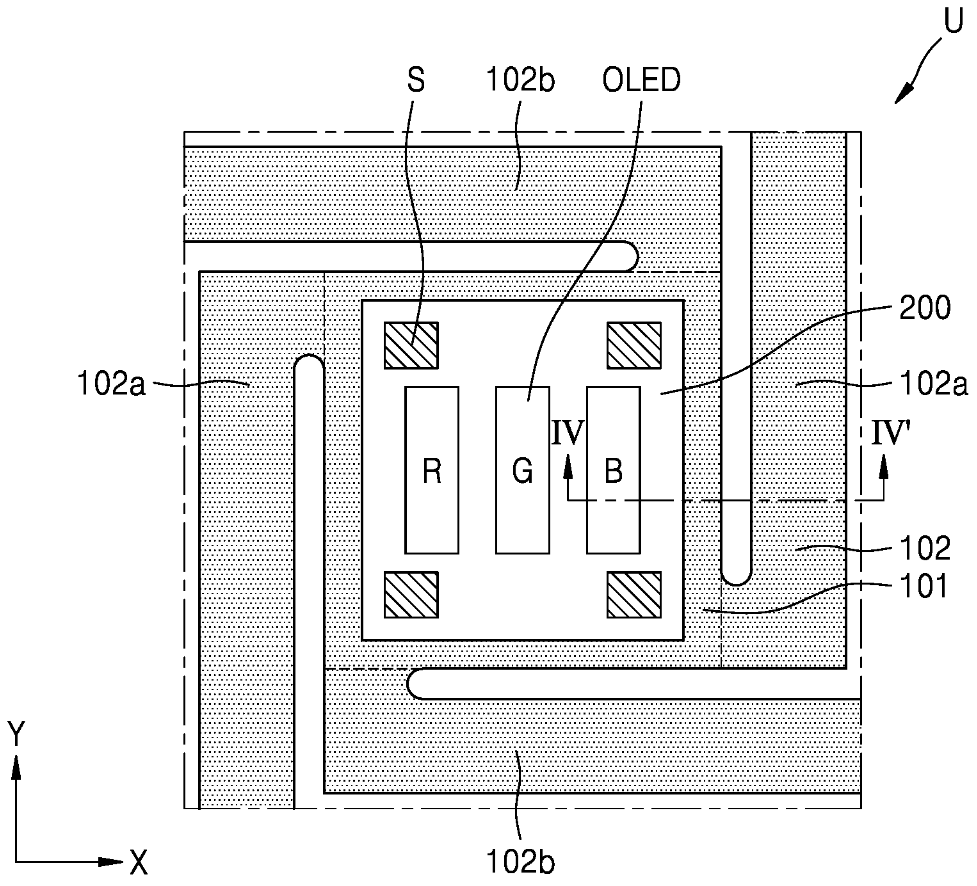
Figure 5:
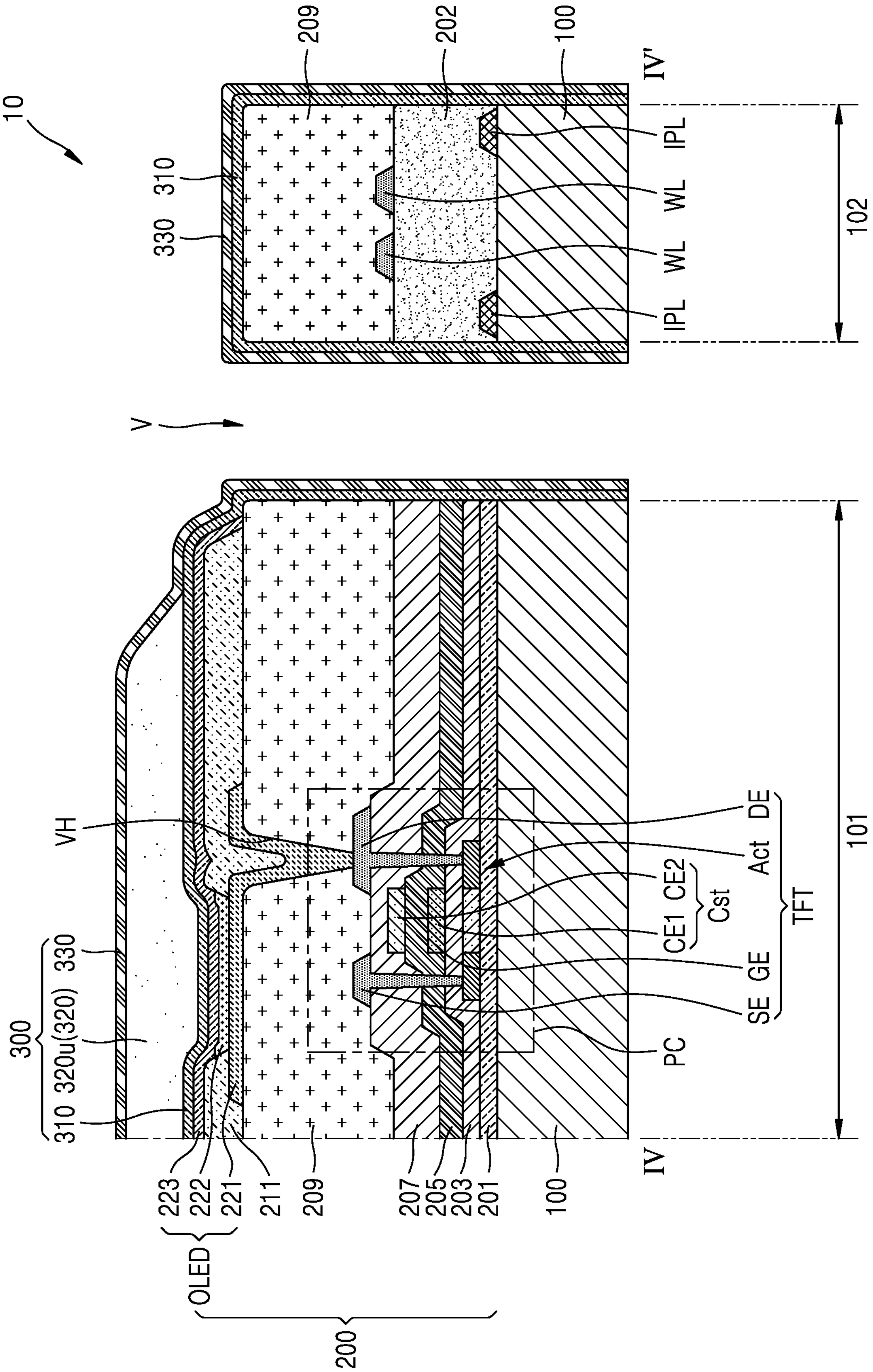
FIG. 5 is a cross-sectional view of the unit display unit taken along line IV-IV' of FIG. 4A or 4B.

FIGS. 4A and 4B are schematic plan views of the unit display unit of FIG. 1. FIG. 5 is a cross-sectional view of the unit display unit taken along line IV-IV' of FIG. 4A or 4B.

Referring to FIGS. 4A to 5, in an embodiment, a unit display unit 200 and an encapsulation layer 300 sealing the unit display unit 200 may be located in the display area 101 of the unit U. In an embodiment, the bridge area 102 may include a pair of first bridge areas 102*a* located on opposite sides with respect to the display area 101 and extending in a direction parallel to a second direction (Y-axis direction) and a pair of second bridge areas 102*b* located on opposite sides with respect to the display area 101 and extending in a direction parallel to a first direction (X-axis direction), as shown in FIG. 4A. In another embodiment, the bridge area 102 may include a pair of first bridge areas 102*a* located on opposite sides with respect to the display area 101 and extending in a direction parallel to a second direction (Y-axis direction) and a pair of second bridge areas 102*b* located on opposite sides with respect to the display area 101 and extending in a direction parallel to a first direction (X-axis direction), as shown in FIG. 4B.

The unit display unit 200 is disposed in the display area 101, at least one organic light-emitting diode OLED that emits, for example, red light, blue light, green light, or white light may be located in the unit display unit 200, and an organic light-emitting diode OLED may be electrically connected to a thin-film transistor TFT. In an embodiment, the organic light-emitting diode OLED may define a display element. However, the disclosure is not limited thereto, and the unit display unit 200 may include various types of display elements, such as an inorganic electroluminescent (EL) device, a quantum dot light-emitting device, and a liquid crystal device.

Each of the unit display units 200 may include a plurality of organic light-emitting diodes OLED that emit light of different colors from each other. In an embodiment, for example, as shown in FIGS. 4A and 4B, one unit display unit 200 may include an organic light-emitting diode OLED that emits light of red color R, an organic light-emitting diode OLED that emits light of green color G, and an organic light-emitting diode OLED that emits light of blue color B to form one pixel.

However, the disclosure is not limited thereto. In another embodiment, for example, each of the unit display units 200 may include one organic light-emitting diode OLED that emits red light, blue light, green light, or white light to form a subpixel. In another embodiment, for example, the unit display units 200 may include a plurality of pixels.

In addition, the organic light-emitting diodes OLED in the unit display unit 200 may be arranged in various arrangements, such as an RGB method, a Pentile structure, and a honeycomb structure, according to efficiency of a material included in an organic emission layer.

A spacer S may be disposed or formed in the perimeter of the unit display unit 200. The spacer S is a member for preventing mask scratches, and may be located higher than the organic light-emitting diode OLED on an upper surface of the substrate 100. FIGS. 4A and 4B illustrate an embodiment where the spacer S is provided in an outer corner area which is the edge of the unit display unit 200, but the disclosure is not limited thereto. In another embodiment, for example, the spacer S may be arranged inside the unit display unit 200. In another embodiment, for example, the spacer S may be provided above a pixel-defining layer 211 formed in the unit display unit 200.

In an embodiment, as shown in FIG. 5, the display panel 10 includes the substrate 100, the unit display unit 200 including a planarization layer 209, and the encapsulation layer 300 sealing each unit display unit 200. The unit display unit 200 may be disposed on the substrate 100 in the display area 101, and wires WL may be disposed in the bridge area 102 connecting the display areas 101 together.

First, the unit display unit 200 and the encapsulation layer 300 arranged in the display area 101 will be described in a stacking order.

The substrate 100 may be disposed in the display area 101. The substrate 100 may include various materials. In detail, the substrate 100 may include glass, metal, an organic material, or other suitable materials.

In an embodiment, the substrate 100 may include a flexible material. In an embodiment, for example, the substrate 100 may include a material that is able to be bent, curved, folded, or rolled. A flexible material forming the substrate 100 may be ultra-thin glass, metal, or plastic. In an embodiment where the substrate 100 includes plastic, the substrate 100 may include polyimide (PI). In another embodiment, for example, the substrate 100 may include other types of plastic materials.

A buffer layer 201 may be formed on the substrate 100 to prevent penetration of impurities into a semiconductor layer Act of the thin-film transistor TFT. The buffer layer 201 may include an inorganic insulating material, such as silicon oxide, silicon nitride, or silicon oxynitride, and may be defined by a single layer or multilayer, each layer therein including at least one selected from the above-described inorganic insulating materials.

The pixel circuit PC includes the thin-film transistor TFT and a storage capacitor Cst. The thin-film transistor TFT may be disposed on the buffer layer 201. The thin-film transistor TFT may include the semiconductor layer Act, a gate electrode GE, a source electrode SE, and a drain electrode DE. In an embodiment, the thin-film transistor TFT is a top gate type in which the gate electrode GE is disposed on the semiconductor layer Act with a gate insulating layer 203 therebetween, but according to another embodiment, the thin-film transistor TFT may be a bottom gate type.

The semiconductor layer Act may include polysilicon. Alternatively, the semiconductor layer Act may include amorphous silicon, an oxide semiconductor, or an organic semiconductor. The gate electrode GE may include a low-resistance metal material. The gate electrode GE may include a conductive material including molybdenum (Mo), aluminum (Al), copper (Cu), titanium (Ti), or the like, and may be formed as (or defined by) a multilayer or single layer, each layer therein including at least one selected from the above materials.

The gate insulating layer 203 between the semiconductor layer Act and the gate electrode GE may include an inorganic insulating material, such as silicon oxide, silicon nitride, silicon oxynitride, aluminum oxide, titanium oxide, tantalum oxide, or hafnium oxide. The gate insulating layer 203 may be defined by a single layer or multilayer, each layer including at least one selected from the above-described materials.

Each of the source electrode SE and the drain electrode DE may include a material exhibiting high conductivity. Each of the source electrode SE and the drain electrode DE may include a conductive material including molybdenum (Mo), aluminum (Al), copper (Cu), or titanium (Ti), and may be formed as a multilayer or single layer, each layer therein including at least one selected from the above materials. In an embodiment, each of the source electrode SE and the drain electrode DE may be formed as a multilayer of Ti/Al/Ti.

The storage capacitor Cst includes a lower electrode CE1 and an upper electrode CE2 overlapping each other with a first interlayer insulating layer 205 therebetween. The storage capacitor Cst may overlap the thin-film transistor TFT. In an embodiment, as illustrated in FIG. 5, the gate electrode GE of the thin-film transistor TFT is the lower electrode CE1 of the storage capacitor Cst. In another embodiment, the storage capacitor Cst may not overlap the thin-film transistor TFT. The storage capacitor Cst may be covered with a second interlayer insulating layer 207.

Each of the first and second interlayer insulating layers 205 and 207 may include an inorganic insulating material, such as silicon oxide, silicon nitride, silicon oxynitride, aluminum oxide, titanium oxide, tantalum oxide, or hafnium oxide. Each of the first and second interlayer insulating layers 205 and 207 may be defined by a single layer or multilayer, each layer therein including at least one selected from the above-described materials.

The pixel circuit PC including the thin-film transistor TFT and the storage capacitor Cst may be covered with the planarization layer 209.

The planarization layer 209 may include an organic insulating material, such as a general purpose polymer, such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or a blend thereof. In an embodiment, for example, the planarization layer 209 may include polyimide.

In another embodiment, the planarization layer 209 may include an inorganic insulating material, such as silicon oxide, silicon nitride, silicon oxynitride, aluminum oxide, titanium oxide, tantalum oxide, or hafnium oxide. In another embodiment, the planarization layer 209 may have a structure in which an organic insulating layer and an inorganic insulating layer are stacked one on another.

To form the planarization layer 209, a liquid organic material is coated to cover the thin-film transistor TFT, and then a mask process and a developing process may be performed to form a via hole VH exposing the drain electrode DE of the thin-film transistor TFT. As such, the planarization layer 209 may be formed by curing a liquid organic material and thus may have an upper surface that is approximately flat.

A pixel electrode 221 may be formed on the planarization layer 209. The pixel electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 221 may further include a film including ITO, IZO, ZnO, or $In_2O_3$ over and/or under the above-described reflective film.

The pixel-defining layer 211 may be formed on the pixel electrode 221. The pixel-defining layer 211 may be provided with an opening defined therethrough to expose an upper surface of the pixel electrode 221 and may cover an edge of the pixel electrode 221. Accordingly, the pixel-defining layer 211 may define an emission area of a pixel. The pixel-defining layer 211 may include an organic insulating material. Alternatively, the pixel-defining layer 211 may include an inorganic insulating material, such as silicon nitride ($SiN_x$), silicon oxynitride ($SiO_xN_y$), or silicon oxide ($SiO_x$). Alternatively, the pixel-defining layer 211 may include an organic insulating material and an inorganic insulating material.

An intermediate layer 222 of the organic light-emitting diode OLED may include a low molecular weight or polymer material. In an embodiment where the intermediate layer 222 includes a low molecular weight material, the intermediate layer 222 may have a structure in which a hole injection layer, a hole transport layer, an emission layer, an electron transport layer, an electron injection layer, and the like are stacked in a single or complex structure, and may include at least one selected from various organic materials, including copper phthalocyanine (CuPc), N,N'-Di(naphthalene-1-yl)-N,N'-diphenyl-benzidine (NPB), tris-8-hydroxyquinoline aluminum ($Alq_3$), and the like. These layers may be formed by vacuum deposition.

In an embodiment where the intermediate layer 222 includes a polymer material, the intermediate layer 222 may usually have a structure including a hole transport layer and an emission layer. In such an embodiment, the hole transport layer may include poly((3,4)-ethylenedioxythiophene) (PEDOT), and the emission layer may include a polymer material, such as poly-phenylenevinylene (PPV)-based polymer and polyfluorene-based polymer. The intermediate layer 222 may be formed by screen printing, inkjet printing, laser induced thermal imaging (LITI), or the like.

The intermediate layer 222 is not necessarily limited thereto, and may have various structures. In addition, the intermediate layer 222 may include a layer that is integrally formed over a plurality of pixel electrodes 221, and may include a layer that is patterned to correspond to each of the plurality of pixel electrodes 221.

An opposite electrode 223 may include a conductive material having a low work function. In an embodiment, for example, the opposite electrode 223 may include a transparent layer or semi-transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 223 may further include a layer including ITO, IZO, ZnO, or $In_2O_3$ on the transparent layer or semi-transparent layer including the above-described material. The intermediate layer 222 and the opposite electrode 223 may be formed by thermal deposition.

A capping layer (not shown) for protecting the opposite electrode 223 may be further disposed above the opposite electrode 223. The capping layer may include an inorganic material such as LiF, and/or an organic material.

The encapsulation layer 300 sealing the unit display unit 200 is formed on the opposite electrode 223. The encapsulation layer 300 blocks external oxygen or moisture and may be defined by a single layer or a plurality of layers. The encapsulation layer 300 may include at least one selected from an organic encapsulation layer and an inorganic encapsulation layer.

FIG. 5 illustrates an embodiment where the encapsulation layer 300 includes a first inorganic encapsulation layer 310, a second inorganic encapsulation layer 330, and an organic encapsulation layer 320 arranged therebetween, but the disclosure is not limited thereto. In another embodiment, the number of organic encapsulation layers, the number of inorganic encapsulation layers, and a stacking order may be changed or variously modified.

Each of the first inorganic encapsulation layer 310 and the second inorganic encapsulation layer 330 may include at least one inorganic insulating material, such as aluminum oxide, titanium oxide, tantalum oxide, hafnium oxide, zinc oxide, silicon oxide, silicon nitride, or silicon oxynitride, and may be formed by chemical vapor deposition (CVD). The organic encapsulation layer 320 may include a polymer-based material. The polymer-based material may include acrylic resin, epoxy-based resin, polyimide, polyethylene, or the like.

In an embodiment, the first inorganic encapsulation layer 310 may be formed along a structure thereunder and thus does not have a flat upper surface as shown in FIG. 5. The organic encapsulation layer 320 covers the first inorganic encapsulation layer 310, and unlike the first inorganic encapsulation layer 310, may have an upper surface that is approximately flat. In detail, the organic encapsulation layer 320 may have an upper surface that has an approximately flat portion corresponding to the organic light-emitting diode OLED as a display element. In addition, the organic encapsulation layer 320 may relax stress generated in the first and second inorganic encapsulation layers 310 and 330.

The organic encapsulation layer 320 may include PMMA, polycarbonate (PC), PS, acrylic resin, epoxy-based resin, polyimide, polyethylene, polyethylene sulfonate, polyoxymethylene, polyarylate, or hexamethyldisiloxane.

In an embodiment, the organic encapsulation layer 320 includes unit organic encapsulation layers 320*u* corresponding to the unit display units 200, respectively. In such an embodiment, each of the unit organic encapsulation layers 320*u* may be disposed above the display area 101 of the substrate 100 and may not be arranged in the bridge area 102. Accordingly, the first inorganic encapsulation layer 310 and the second inorganic encapsulation layer 330 may be in contact with each other outside the unit organic encapsulation layer 320*u* to separately encapsulate each of the unit display units 200.

In such an embodiment, as described above, the encapsulation layer 300 includes the first inorganic encapsulation layer 310, the organic encapsulation layer 320, and the second inorganic encapsulation layer 330, and thus, even when cracks occur in the encapsulation layer 300 via such a multilayer structure, the cracks may not be connected or transmitted to each other between the first inorganic encapsulation layer 310 and the organic encapsulation layer 320 or between the organic encapsulation layer 320 and the second inorganic encapsulation layer 330. Accordingly, formation of a path through which moisture or oxygen from the outside penetrates into the unit display unit 200 may be effectively prevented or substantially reduced. In addition, the second inorganic encapsulation layer 330 is in contact with the first inorganic encapsulation layer 310 at an edge located outside the unit organic encapsulation layer 320*u*, so that the unit organic encapsulation layer 320*u* may be effectively prevented from being exposed to the outside.

The first inorganic encapsulation layer 310 and the second inorganic encapsulation layer 330 may be formed on an entire surface of the substrate 100 by using CVD, and the first inorganic encapsulation layer 310 and the second inorganic encapsulation layer 330 may be formed to cover a side surface of the through portion V.

In forming the unit organic encapsulation layer 320*u*, a certain amount of a liquid organic material is coated to correspond to the unit display unit 200 and then cured. In this case, due to characteristics of the liquid organic material, flow occurs in a direction of an edge of the unit display unit 200. In an embodiment, a dam structure (not shown) and/or a concave recess structure (not shown) may be further provided at the edge of the unit display unit 200 to prevent such flow.

The wires WL may be disposed in the bridge area 102 to supply various signals and/or voltage to the unit display unit 200. The wires WL may include the same material as that of the source electrode SE or the drain electrode DE of the thin-film transistor TFT. Alternatively, each of the wires WL disposed above an organic material layer 202 may include the same material as that of the gate electrode GE of the thin-film transistor TFT. The wires WL are provided in a central portion of the bridge area 102 and may be arranged apart from each other.

The wires WL may be covered with the planarization layer 209. The opposite electrode 223, the first inorganic encapsulation layer 310, and the second inorganic encapsulation layer 330 may be disposed above the planarization layer 209. The opposite electrode 223, the first inorganic encapsulation layer 310, and the second inorganic encapsulation layer 330 are formed by using an open mask after the through portion V is formed, and may surround the side surface of the through portion V. In an embodiment, the pixel-defining layer 211 may be further arranged between the planarization layer 209 and the opposite electrode 223, and although not shown, the capping layer may be further arranged between the opposite electrode 223 and the first inorganic encapsulation layer 310.

The bridge area 102 may have a smaller width than that of the display area 101 and thus may be vulnerable to stress caused by shape deformation of a display apparatus. Accordingly, cracks may occur in the wires WL arranged in the bridge area 102, and thus it is desired to design so that a neutral plane is formed at positions of the wires WL.

In an embodiment, a pattern layer IPL including an inorganic material and the organic material layer 202 covering the pattern layer IPL are introduced between the bridge area 102 of the substrate 100 and the wires WL, so that a neutral plane is formed according to positions of the wires WL.

In an embodiment, the pattern layer IPL may be arranged at an edge of the bridge area 102. In such an embodiment, the pattern layer IPL may be arranged at an edge of the bridge area 102 that does not overlap the wires WL. Since the wires WL having a large modulus are not arranged at the edge of the bridge area 102, a position of a neutral plane at the edge of the bridge area 102 may be different from a position of a neutral plane at a central portion of the bridge area 102, such that cracks may propagate to the wires WL due to stress applied from the edge of the bridge area 102 if the pattern layer IPL is not provided.

In an embodiment, the pattern layer IPL including an inorganic material, which has a similar modulus to a modulus of the wires WL, may be disposed at the edge of the bridge area 102 to compensate for a position of a neutral plane, so that stress that may be applied to the wires WL may be reduced.

In some embodiments, the pattern layer IPL may include an inorganic insulating material, such as silicon oxide, silicon nitride, silicon oxynitride, aluminum oxide, titanium oxide, tantalum oxide, or hafnium oxide. In some embodiments, the pattern layer IPL may include the same material as that of at least one of the buffer layer 201, the gate insulating layer 203, the first interlayer insulating layer 205, and the second interlayer insulating layer 207. In such embodiments, after the buffer layer 201, the gate insulating layer 203, the first interlayer insulating layer 205, and the second interlayer insulating layer 207 are formed in the bridge area 102, the pattern layer IPL may be formed by patterning via an etching process in such a manner that portions of the buffer layer 201, the gate insulating layer 203, the first interlayer insulating layer 205, and the second interlayer insulating layer 207 remain. Alternatively, the pattern layer IPL may be provided in various manners, for example, may be formed via a process of depositing and etching a separate inorganic insulating layer.

The organic material layer 202 may be arranged to cover the pattern layer IPL, and the wires WL may be disposed above the organic material layer 202. Since the organic material layer 202 has a lower hardness than that of an inorganic material, the organic material layer 202 may absorb tensile stress caused by shape deformation of the bridge area 102 to effectively prevent or substantially reduce concentration of stress on the wires WL. In addition, as the organic material layer 202 is disposed below the wires WL, a neutral plane may be arranged at positions of the wires WL. In addition, the organic material layer 202 may effectively prevent a height difference from occurring when each of the wires WL extend to the display area 101.

The organic material layer 202 may include an organic insulating material, such as polyimide, polyamide, acrylic resin, benzocyclobutene, hexamethyldisiloxane (HMDSO), or phenolic resin. The organic material layer 202 may be provided as a single layer or multilayer, each layer therein including at least one selected from the organic insulating materials listed above.

Figure 6A:
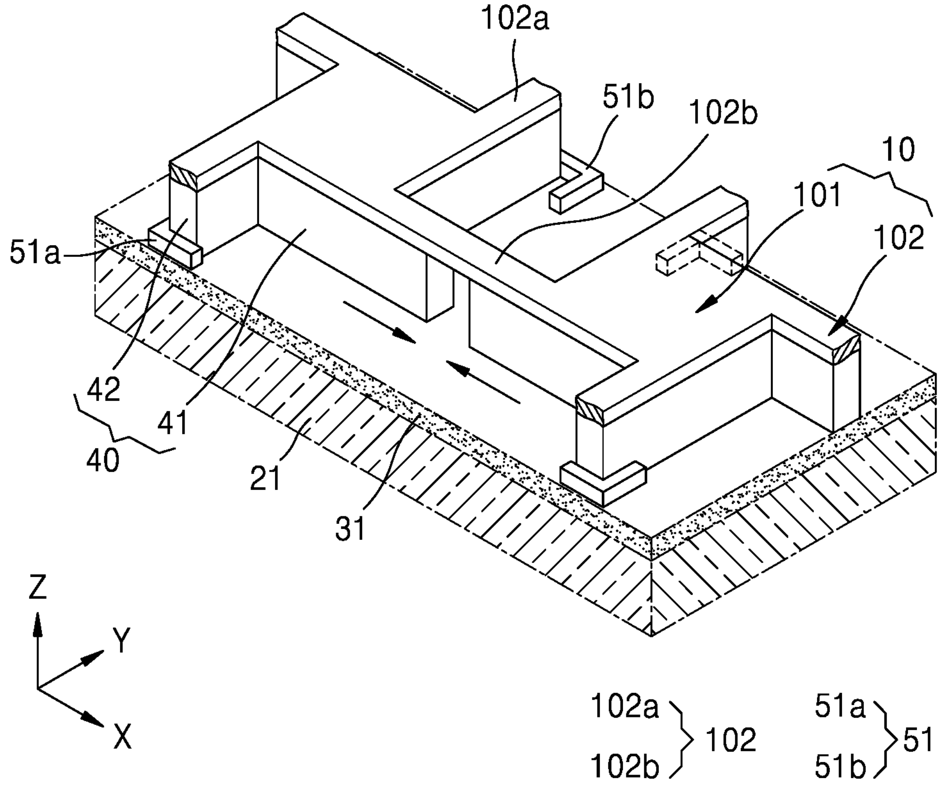
FIG. 6A is a perspective view of a portion of a display apparatus according to an embodiment.
Figure 6B:
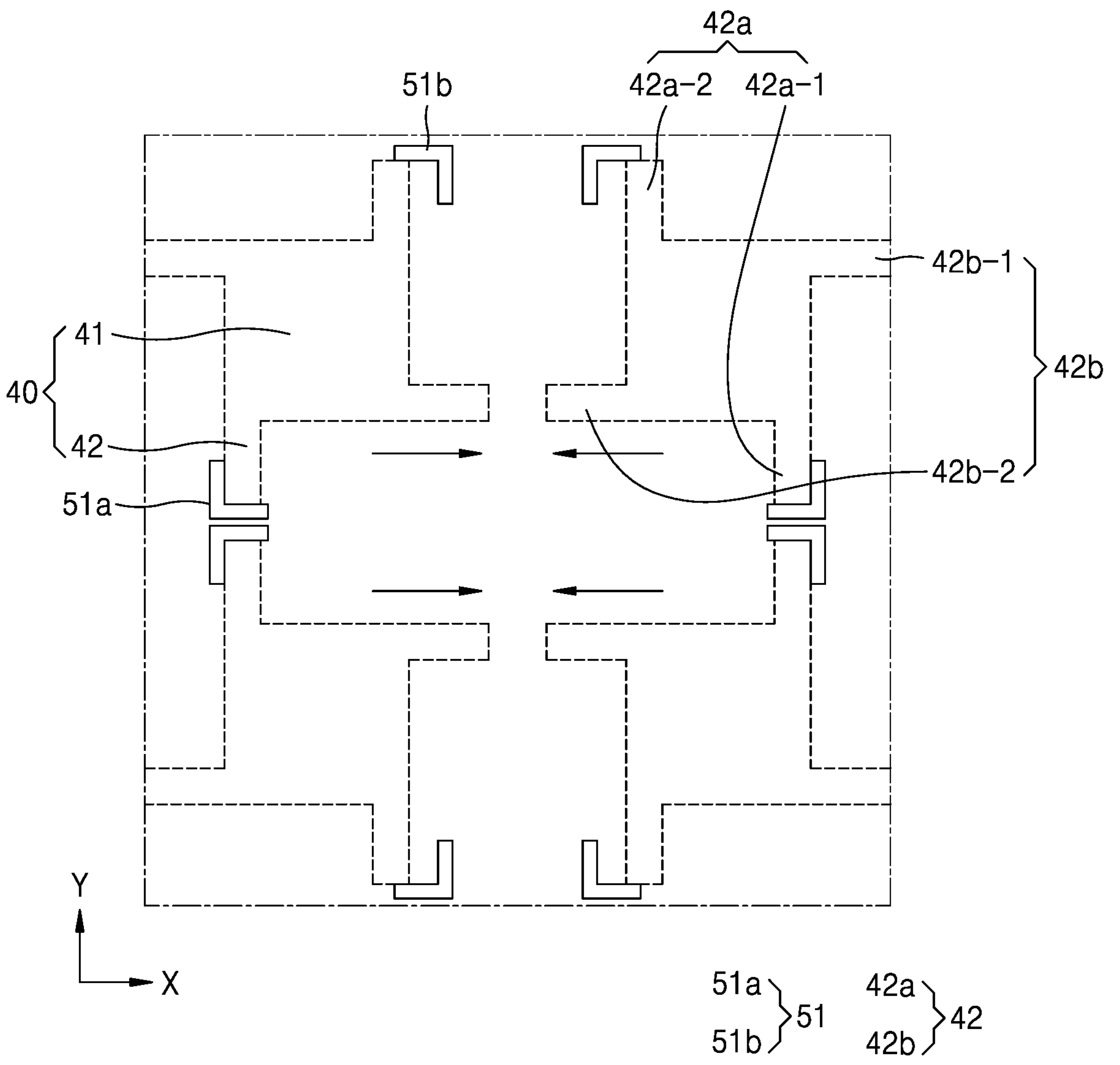
FIG. 6B is a plan view of a portion of the display apparatus of FIG. 6A.

FIG. 6A is a perspective view of a portion of a display apparatus according to an embodiment. FIG. 6B is a plan view of a portion of the display apparatus of FIG. 6A.

Referring to FIGS. 6A and 6B, a display apparatus may include a unit. The unit may include the display panel 10 including the display area 101 and the bridge area 102, one support member 40, and a plurality of stopper units. One support member 40 and the plurality of stopper units may be arranged to correspond to the unit. In an embodiment, the display area 101 and the bridge area 102, which are arranged to correspond to the unit, and the support member 40 and the plurality of stopper units, which are arranged to correspond to the unit, may be symmetric with another display area 101, bridge area 102, support member 40 and stopper units, with respect to an imaginary straight line passing between the units adjacent to each other. In such an embodiment, the relationship between the units adjacent to each other, the relationship between the support members 40 adjacent to each other, and the relationship between the stopper units arranged in the units adjacent to each other are similar to each other. Thus, hereinafter, for convenience of description, the supports members 40 adjacent to each other will be mainly described in detail.

The support members 40 adjacent to each other may be symmetric with each other with respect to an imaginary straight line, in a second direction (Y-axis direction), passing between the support members 40 adjacent to each other. In such an embodiment, the support member 40 may be disposed under the display panel 10 to support a portion of the display panel 10. In an embodiment, for example, the support member 40 may support the entire display area 101 and support a portion of the bridge area 102. In an embodiment, the support member 40 may be fixed to at least a portion of the display panel 10 with an adhesive or the like.

The support member 40 may include a body portion 41 corresponding to the display area 101 and a protrusion portion 42 corresponding to the bridge area 102. In an embodiment, a center of the display area 101 and a center of the body portion 41 may substantially coincide or aligned with each other. The protrusion portion 42 may protrude from an end of the body portion 41. In addition, the number of protrusion portions 42 may be the same as the number of bridge areas 102 connected to the display area 101. In such an embodiment, each of the protrusion portions 42 may be disposed below each of the bridge areas 102, and when viewed in a plan view, the protrusion portion 42 may be arranged to overlap a portion of each of the bridge areas 102 to support each of the bridge areas 102.

The protrusion portion 42 may include a first protrusion portion 42*a* supporting a first bridge area 102*a* and a second protrusion portion 42*b* supporting a second bridge area 102*b*. In an embodiment, the first protrusion portion 42*a* may include a first-first protrusion portion 42*a*-1 and a first-second protrusion portion 42*a*-2, which protrude from the body portion 41 in opposite directions. In addition, the second protrusion portion 42*b* may include a second-first protrusion portion 42*b*-1 and a second-second protrusion portion 42*b*-2, which protrude from the body portion 41 in opposite directions.

A stopper unit may be disposed on the first adhesive member 31 together with the support member 40. In an embodiment, a plurality of stopper units may be provided. In an embodiment, a height (or thickness) of the stopper unit may be smaller than a height (or thickness) of the support member 40. Therefore, when the display apparatus contracts, the stopper unit may allow the display apparatus to smoothly contract by not interfering with a movement of the bridge area 102.

The stopper unit may include first stopper units 51 arranged to be apart from each other. In an embodiment, each of the first stopper units 51 may include a first-first stopper unit 51*a* and a first-second stopper unit 51*b*.

The first-first stopper unit 51*a* and the first-second stopper unit 51*b* may be arranged in opposite areas with respect to the center of the display area 101 or the center of the body portion 41 arranged to correspond to the display area 101.

In such an embodiment, the first-first stopper unit 51*a* and the first-second stopper unit 51*b* may be similarly formed, that is, formed to have a similar shape to each other. In an embodiment, for example, at least one selected from the first-first stopper unit 51*a* and the first-second stopper unit 51*b* may be in the form of a pillar. In an embodiment, for example, at least one selected from the first-first stopper unit 51*a* and the first-second stopper unit 51*b* may be in the form of a cylinder, an elliptic cylinder, and/or a polygonal cylinder. In another embodiment, at least one selected from the first-first stopper unit 51*a* and the first-second stopper unit 51*b* may include a pillar having an atypical planar shape, such as a star shape, other than a circular, elliptical, or polygonal planar shape. However, hereinafter, for convenience of description, embodiments where each of the first-first stopper unit 51*a* and the first-second stopper unit 51*b* includes a bent planar shape will be described in detail.

Each of the first-first stopper unit 51*a* and the first-second stopper unit 51*b* may be formed in a '⌋' shape (or an "L"-like shape). In an embodiment, a corner of the body portion 41 or a corner of the protrusion portion 42 may selectively contact with a concave portion of at least one selected from the first-first stopper unit 51*a* and the first-second stopper unit 51*b*.

In an embodiment, for example, as shown in FIGS. 6A and 6B, the first-first stopper unit 51*a* may be in contact with the first-first protrusion portion 42*a*-1. In such an embodiment, when the support member 40 rotates by an external force or the like, the first-first stopper unit 51*a* may be arranged outside the support member 40 with respect to a rotation direction of the support member 40. In an embodiment, for example, when the support member 40 is about to rotate clockwise, the first-first stopper unit 51*a* may be arranged on the left of the first-first protrusion portion 42*a*-1 as shown in FIGS. 6A and 6B. In such an embodiment, a corner of the first-first protrusion portion 42*a*-1 may be in contact with a concave portion of the first-first stopper unit 51*a*. The first-second stopper unit 51*b* may be apart from the corner of the first-second protrusion portion 42*a*-2. In an embodiment, similarly to the first-first stopper unit 51*a*, the first-second stopper unit 51*b* may also be arranged on the right of the first-second protrusion portion 42*a*-2. In such an embodiment, the first-second stopper unit 51*b* may be in contact with the first-second protrusion portion 42*a*-2 on one surface, whereas the first-second stopper unit 51*b* may not be in contact with the first-second protrusion portion 42*a*-2 on the other surface. In such an embodiment, based on FIG. 6B, a right side surface of the first-second protrusion portion 42*a*-2 may not be in contact with a left surface of the first-second stopper unit 51*b*.

In such an embodiment, the first-first stopper unit 51*a* may substantially reduce or effectively prevent rotation of the support member 40 by an external force or the like.

In an embodiment, when heat is applied to a display apparatus, at least one of the first member 21 and a second member (not shown) contracts, and thus the display areas 101 apart from each other may be adjacent to each other. In an embodiment, a contraction direction of the display apparatus may vary depending on a shape of a mold. However, hereinafter, embodiments where the contraction direction of the display apparatus is parallel to an X-axis direction shown in FIGS. 6A and 6B will be described in detail.

Figure 6C:
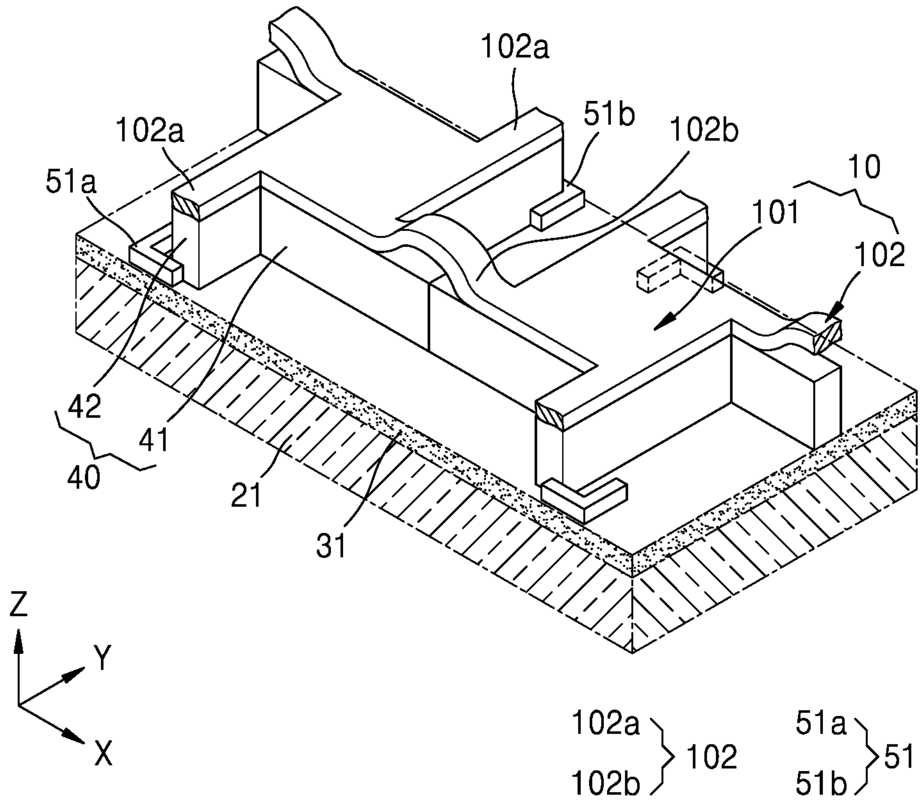
FIG. 6C is a perspective view showing a shape in which a portion of the display apparatus of FIG. 6A has contracted.
Figure 6D:
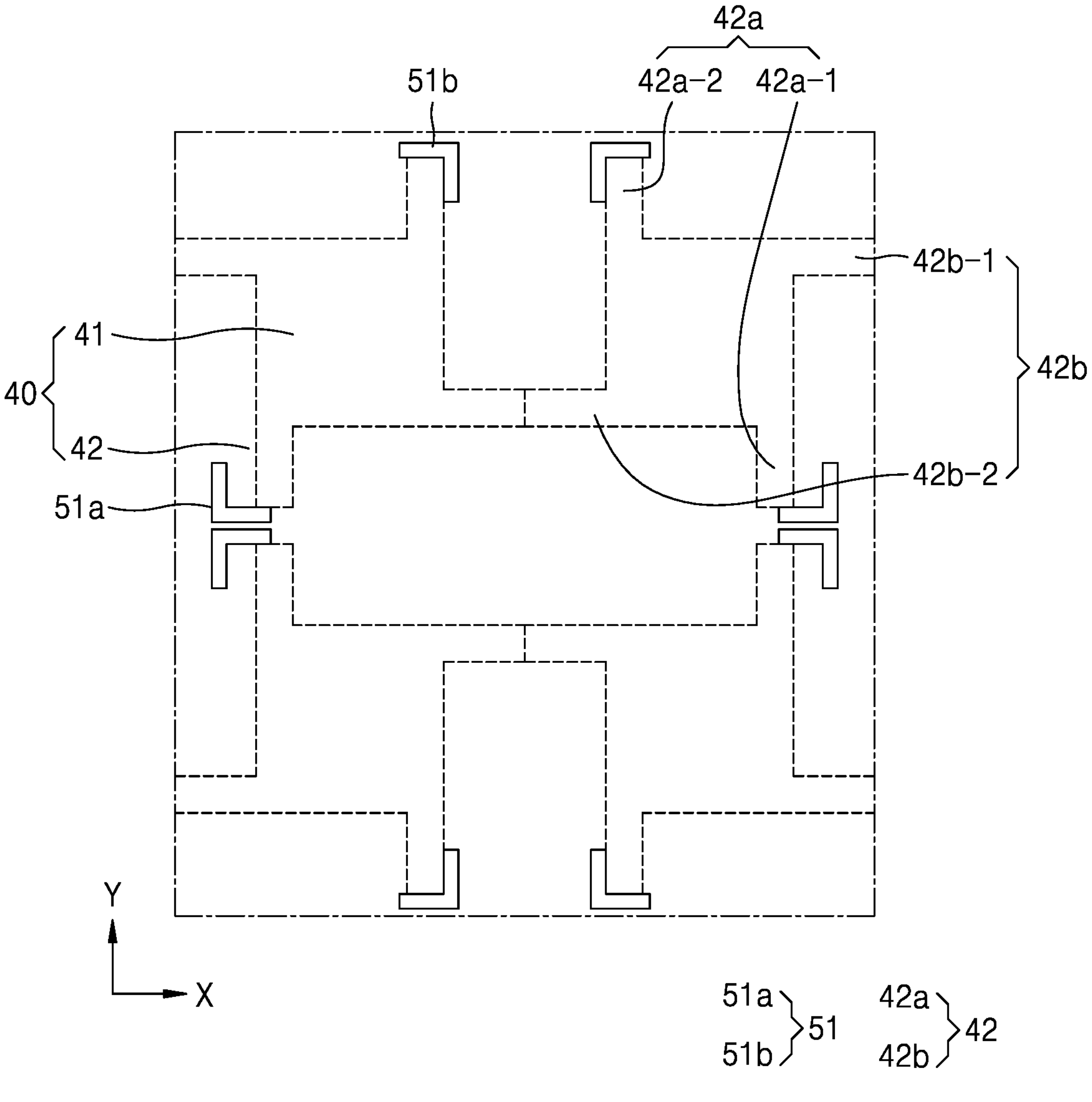
FIG. 6D is a plan view of a portion of the display apparatus of FIG. 6C.

FIG. 6C is a perspective view showing a shape in which a portion of the display apparatus of FIG. 6A has contracted. FIG. 6D is a plan view of a portion of the display apparatus of FIG. 6C.

Referring to FIGS. 6C and 6D, when heat is applied to a display apparatus, at least one selected from the first member 21 and a second member (not shown) may contract. In an embodiment, at least one selected from the first member 21 and the second member contracts, such that the display areas 101 apart from each other may be adjacent to each other. Each of the bridge areas 102 may form an arch shape according to movement of the display area 101. In an embodiment, a central portion of each bridge area 102 may protrude upward more than other portions of each bridge area 102 do.

The display apparatus may have different contraction directions depending on a shape of a mold in which the display apparatus is arranged. Hereinafter, for convenience of description, a case where the display apparatus contracts only in a first direction will be mainly described in detail.

In this case, when the first member 21 contracts, a force to rotate the support member 40 and a force to contract the first member 21 are combined so that a portion of the first member 21 on which the support member 40 is arranged contracts more in the first direction than a portion of the first member 21 on which the support member 40 is not arranged does. Thus, one side surface of the first-first stopper unit 51*a* and the first-first protrusion portion 42*a*-1, which used to be in contact with each other, may be apart from each other, and one side surface of the first-second stopper unit 51*b* and the first-second protrusion portion 42*a*-2, which used to be apart from each other, may be in contact with each other.

In this case, the first-second stopper unit 51*b* is in contact with the first-second protrusion portion 42*a*-2 so that rotation of the support member 40 may be effectively prevented or substantially reduced.

In this case, even when the display apparatus contracts, rotation of the support member 40 may be effectively prevented or substantially reduced, thereby reducing displacement of the display area 101 disposed on the support member 40.

Figure 7A:
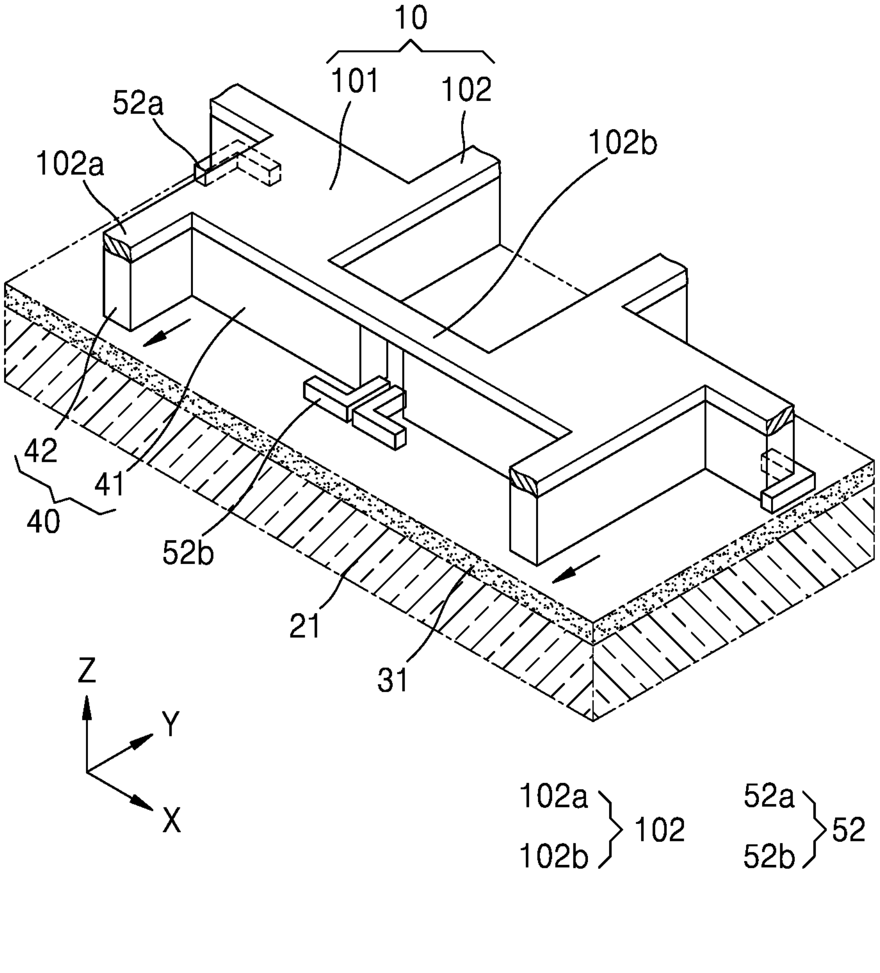
FIG. 7A is a perspective view of a portion of a display apparatus according to another embodiment.
Figure 7B:
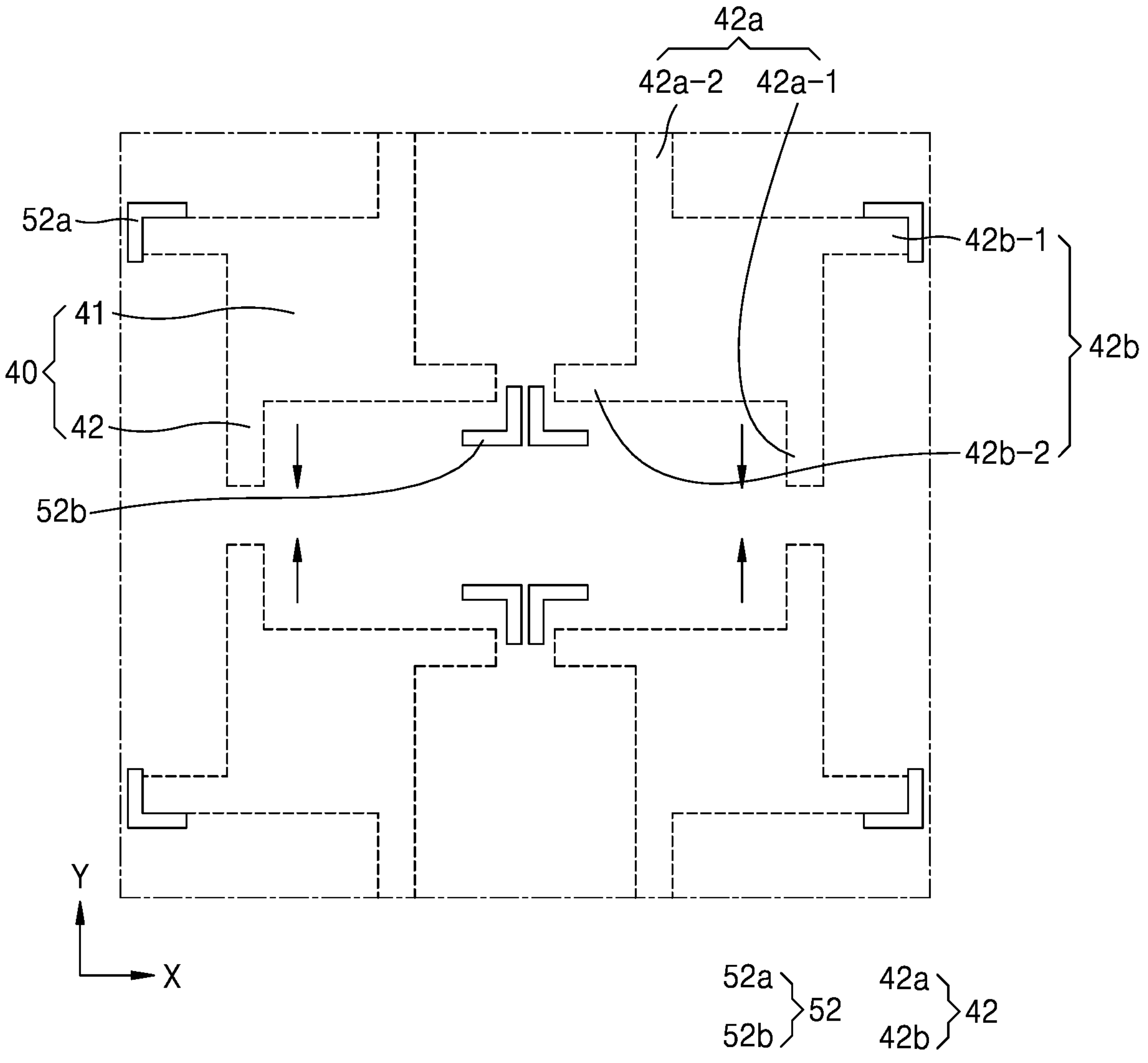
FIG. 7B is a plan view of a portion of the display apparatus of FIG. 7A.

FIG. 7A is a perspective view of a portion of a display apparatus according to another embodiment. FIG. 7B is a plan view of a portion of the display apparatus of FIG. 7A.

Referring to FIGS. 7A and 7B, a display apparatus may include a unit. The unit may include the display panel 10 including the display area 101 and the bridge area 102, one support member 40, and a plurality of stopper units. One support member 40 and the plurality of stopper units may be arranged to correspond to the unit. In an embodiment, the unit, and the support member 40 and the plurality of stopper units, which are arranged to correspond to the unit, may be symmetric with another unit, support member 40 and stopper units, with respect to an imaginary straight line passing between the units adjacent to each other. The unit, the support member 40, and the stopper units may be the same as or similar to those described with reference to FIGS. 6A to 6D, and thus any repetitive detailed descriptions thereof will be omitted.

The display panel 10 may include the display area 101 and the bridge area 102. In addition, the support member 40 may include the body portion 41 and the protrusion portion 42. In such an embodiment, a center of the display area 101 and a center of the body portion 41 may substantially coincide or aligned with each other.

Each of the stopper units may include a plurality of second stopper units 52 arranged apart from each other. In an embodiment, for example, each of the second stopper units 52 may include a second-first stopper unit 52*a* and a second-second stopper unit 52*b*. In an embodiment, the second-first stopper unit 52*a* and the second-second stopper unit 52*b* may be arranged in opposite directions with respect to the center of the body portion 41. In addition, the second-first stopper unit 52*a* and the second-second stopper unit 52*b* may be arranged to correspond to the second-first protrusion portion 42*b*-1 and the second-second protrusion portion 42*b*-2, respectively. In such an embodiment, the second-first stopper unit 52*a* and the second-second stopper unit 52*b* may be arranged to correspond to the protrusion portion 42 extending in a first direction (X-axis direction) perpendicular to a second direction (Y-axis direction) which is a direction in which the first member 21 contracts when heat is applied.

In such an embodiment, separate stopper units may not be arranged on the first-first protrusion portion 42*a*-1 and the first-second protrusion portion 42*a*-2.

In such an embodiment, the second stopper unit 52 includes a shape and/or a material the same as or similar to that of the first stopper unit 51 described with reference to FIGS. 6A to 6D, and thus any repetitive detailed descriptions thereof will be omitted.

In such an embodiment, the second-first stopper unit 52*a* may remain in contact with the second-first protrusion portion 42*b*-1. Alternatively, the second-first stopper unit 52*a* may be arranged in close proximity to the second-first protrusion portion 42*b*-1. The second-second stopper unit 52*b* may be arranged apart from the second-second protrusion portion 42*b*-2. In an embodiment, a distance between the second-second stopper unit 52*b* and the second-second protrusion portion 42b-2 may be greater than a distance between the second-first stopper unit 52a and the second-first protrusion portion 42b-1. In an embodiment, for example, the second-first stopper unit 52a may be in complete contact with the second-first protrusion portion 42b-1, and the second-second stopper unit 52b and the second-second protrusion portion 42b-2 may not be in contact with each other by being apart from each other.

Figure 7C:
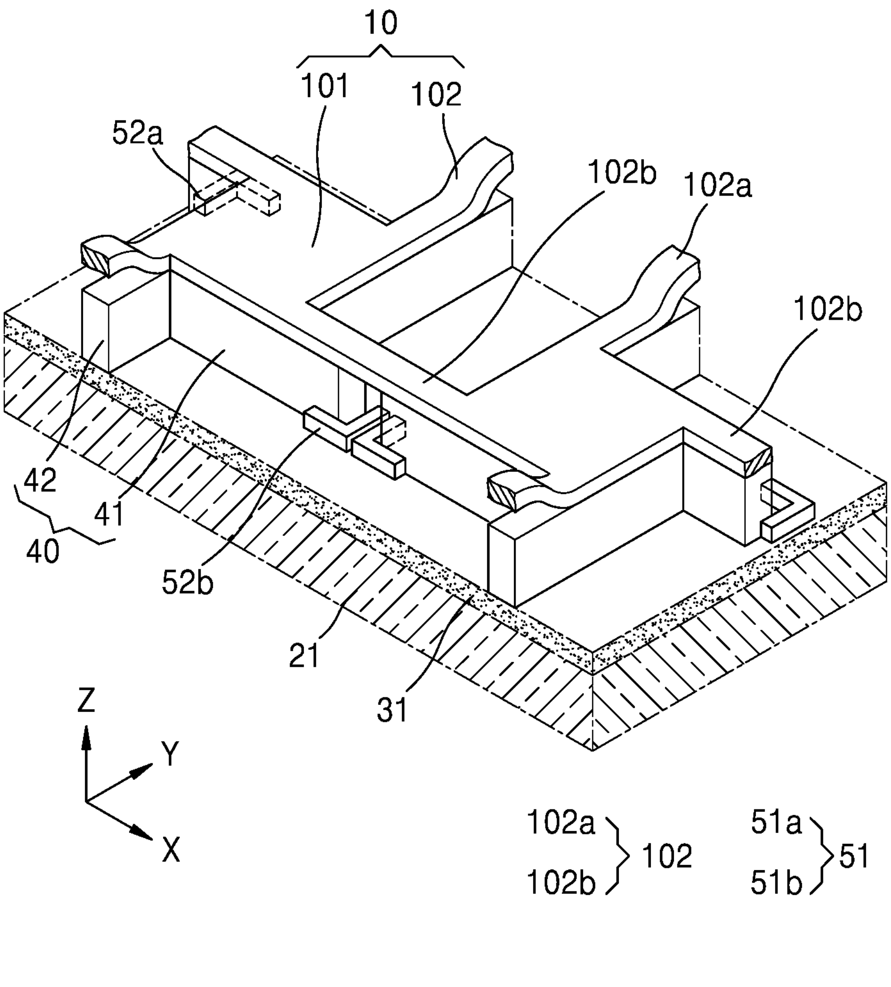
FIG. 7C is a perspective view showing a shape in which a portion of the display apparatus of FIG. 7A has contracted.
Figure 7D:
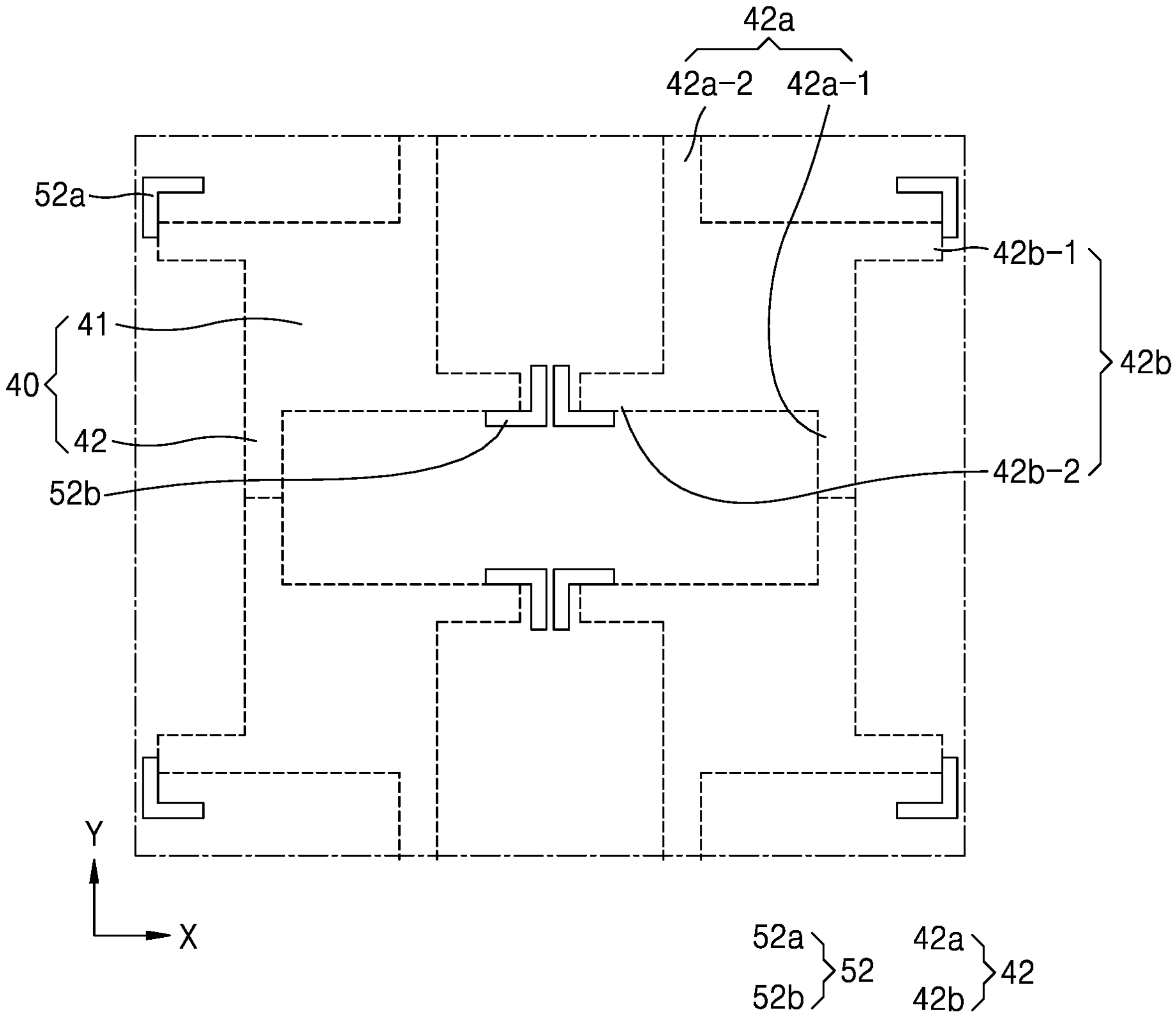
FIG. 7D is a plan view of a portion of the display apparatus of FIG. 7C.

FIG. 7C is a perspective view showing a shape in which a portion of the display apparatus of FIG. 7A has contracted. FIG. 7D is a plan view of a portion of the display apparatus of FIG. 7C.

Referring to FIGS. 7C and 7D, when heat is applied to a display apparatus, at least one selected from the first member 21 and a second member (not shown) may contract. In this case, during the contraction, a shape of the bridge area 102 of the display panel 10 may change. In an embodiment, for example, the bridge area 102 may form an arch shape when the display apparatus contracts.

The display apparatus may have different contraction directions depending on a shape of a mold in which the display apparatus is arranged. Hereinafter, for convenience of description, a case where the display apparatus contracts only in a second direction (Y-axis direction) will be mainly described in detail.

When the display apparatus contracts in the second direction, a distance between support members 40 vertically apart from each other based on FIGS. 7C and 7D may decrease in the second direction. In this case, one side surface of the second-second protrusion portion 42b-2 and the second-second stopper unit 52b, which used not to be in contact with each other, may be in contact with each other, and one side surface of the second-first protrusion portion 42b-1 and the second-first stopper unit 52a, which used to be in contact with each other, may be apart from each other.

Therefore, in an initial state or in the case of contraction, the display apparatus may substantially reduce or effectively prevent rotation of the support member 40 via the second stopper unit 52. In addition, even when the display apparatus contracts, rotation of the support member 40 may be effectively prevented or substantially reduced, thereby reducing displacement of the display area 101 disposed on the support member 40.

Figure 8A:
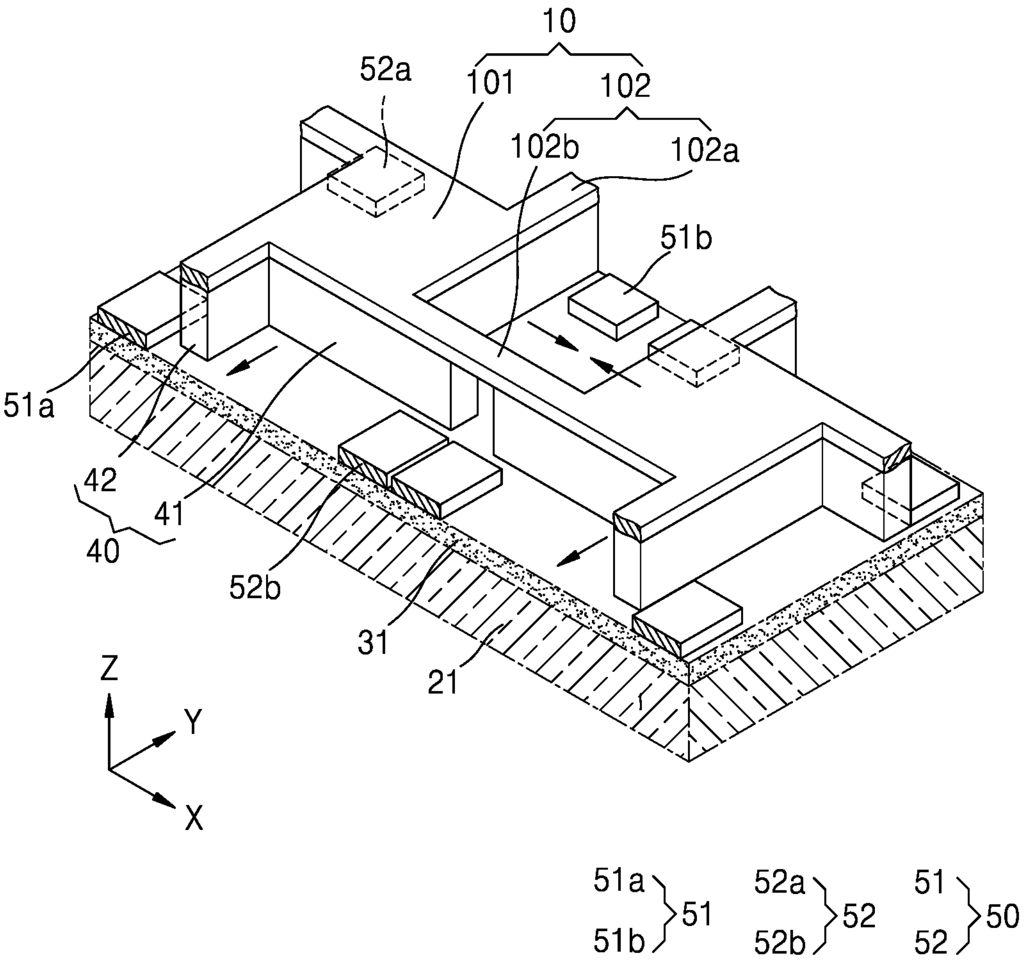
FIG. 8A is a perspective view of a portion of a display apparatus according to another embodiment.
Figure 8B:
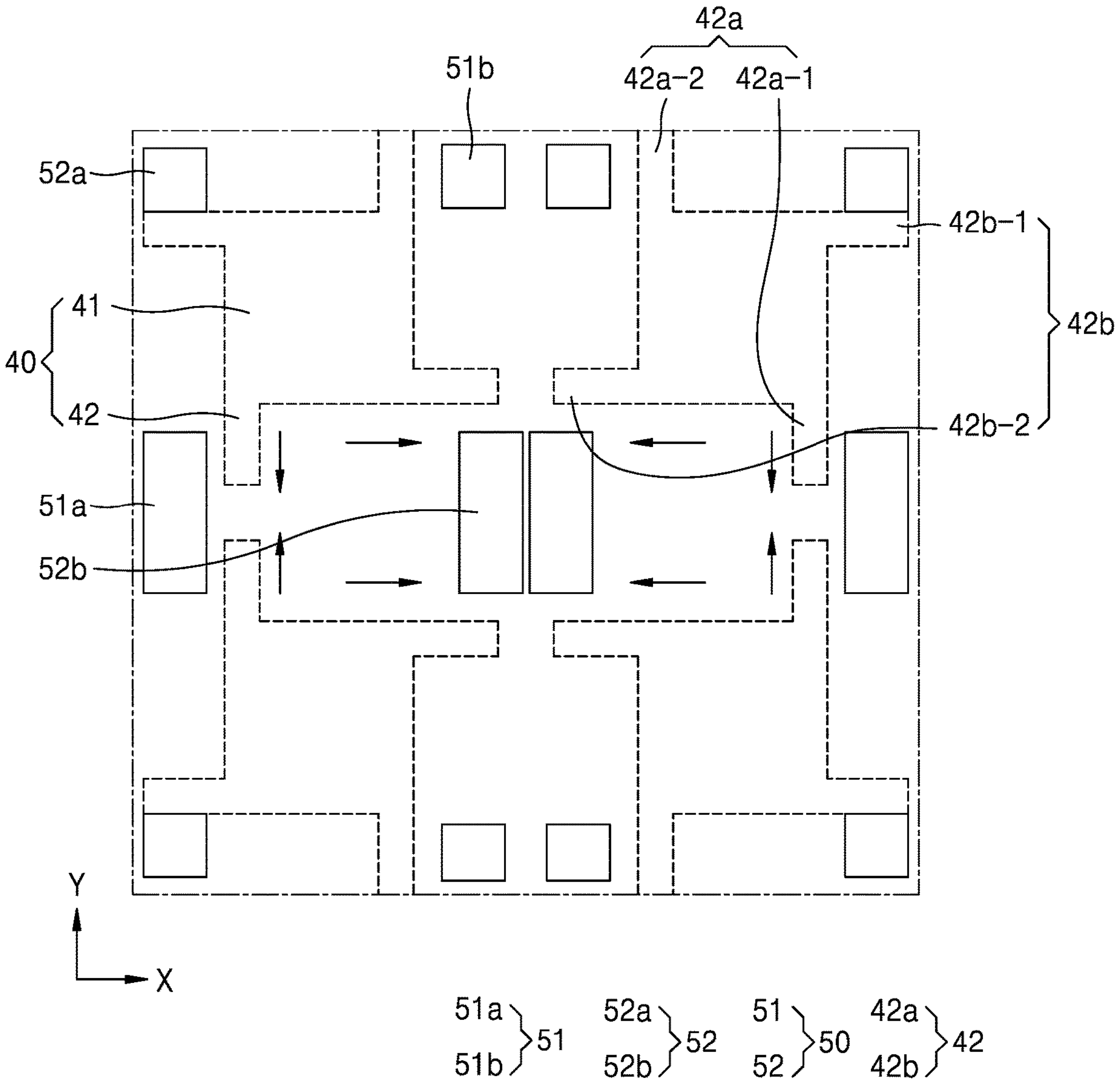
FIG. 8B is a plan view of a portion of the display apparatus of FIG. 8A.

FIG. 8A is a perspective view of a portion of a display apparatus according to another embodiment. FIG. 8B is a plan view of a portion of the display apparatus of FIG. 8A.

Referring to FIGS. 8A and 8B, an embodiment of the display panel 10 may include a unit including the display area 101 and the bridge area 102. One support member 40 and a plurality of stopper units 50 may be arranged to correspond to the unit. In an embodiment, the unit, and the support member 40 and the plurality of stopper units 50, which are arranged to correspond to the unit, may be symmetric with another unit, support member 40 and stopper units 50, with respect to an imaginary straight line passing between the units adjacent to each other. In such an embodiment, the units adjacent to each other, the support members 40 adjacent to each other, and the stopper units 50 respectively arranged in the units adjacent to each other are arranged similarly to each other. Thus, hereinafter, for convenience of description, the support members 40 adjacent to each other will be mainly described in detail.

In such an embodiment, the support members 40 adjacent to each other may be arranged to be symmetric with each other with respect to an imaginary straight line passing between the support members 40 adjacent to each other. In an embodiment, for example, based on FIG. 8B, the support member 40 located on the upper left and the support member 40 located on the upper right may be symmetric with each other with respect to an imaginary straight line passing between the support member 40 located on the upper left and the support member 40 located on the upper right. In such an embodiment, as show in FIG. 8B, the support member 40 located on the upper left and the support member 40 located on the lower left may be symmetric with each other with respect to an imaginary straight line passing between the support member 40 located on the upper left and the support member 40 located on the lower left.

In such an embodiment, each of the stopper units 50 may include the first stopper unit 51 and the second stopper unit 52. In an embodiment, the first stopper unit 51 may include the first-first stopper unit 51a and the first-second stopper unit 51b, and the second stopper unit 52 may include the second-first stopper unit 52a and the second-second stopper unit 52b. In such an embodiment, the first stopper unit 51 may be similar to that described with reference to FIGS. 6A to 6D, and the second stopper unit 52 may be similar to that described with reference to FIGS. 7A to 7D. However, for convenience of description, embodiments where each of the first stopper unit 51 and the second stopper unit 52 has a quadrangular pillar shape will be mainly described in detail.

The support member 40 may include the body portion 41 and the protrusion portion 42. In an embodiment, a center of the display area 101 and a center of the body portion 41 may substantially coincide with each other. A plurality of protrusion portions 42 may be arranged to form a certain angle with respect to the center of the body portion 41. In an embodiment, the plurality of protrusion portions 42 may include the first protrusion portion 42a including the first-first protrusion portion 42a-1 and the first-second protrusion portion 42a-2, and the second protrusion portion 42b including the second-first protrusion portion 42b-1 and the second-second protrusion portion 42b-2. In such an embodiment, the first-first protrusion portion 42a-1 and the first-second protrusion portion 42a-2 may be arranged in opposite directions with respect to the center of the body portion 41, and the second-first protrusion portion 42b-1 and the second-second protrusion portion 42b-2 may be arranged in opposite directions with respect to the center of the body portion 41.

In such an embodiment, the first-first stopper unit 51a may be arranged adjacent to the first-first protrusion portion 42a-1, and the first-second stopper unit 51b may be arranged adjacent to the first-second protrusion portion 42a-2. The second-first stopper unit 52a may be arranged adjacent to the second-first protrusion portion 42b-1, and the second-second stopper unit 52b may be arranged adjacent to the second-second protrusion portion 42b-2.

In such an embodiment, at least one selected from the first stopper unit 51 and the second stopper unit 52 may be arranged to extend to an area of the unit adjacent thereto.

In such an embodiment, the first stopper unit 51 and the second stopper unit 52 may be arranged outside each of the support members 40. In an embodiment, the first-first stopper unit 51a may be apart from the first-first protrusion portion 42a-1, and the first-second stopper unit 51b may be apart from the first-second protrusion portion 42a-2. In addition, the second-first stopper unit 52a may be in contact with or may be arranged in close proximity to the second-first protrusion portion 42b-1, the second-second stopper unit 52b may be apart from the second-second protrusion portion 42b-2. In such an embodiment, a distance between the second-first stopper unit 52a and the second-first protrusion portion 42b-1 may be smaller than at least one of a distance between the first-second stopper unit 51*b* and the first-second protrusion portion 42*a*-2, a distance between the first-first stopper unit 51*a* and the first-first protrusion portion 42*a*-1, and a distance between the second-second stopper unit 52*b* and the second-second protrusion portion 42*b*-2.

Figure 8C:
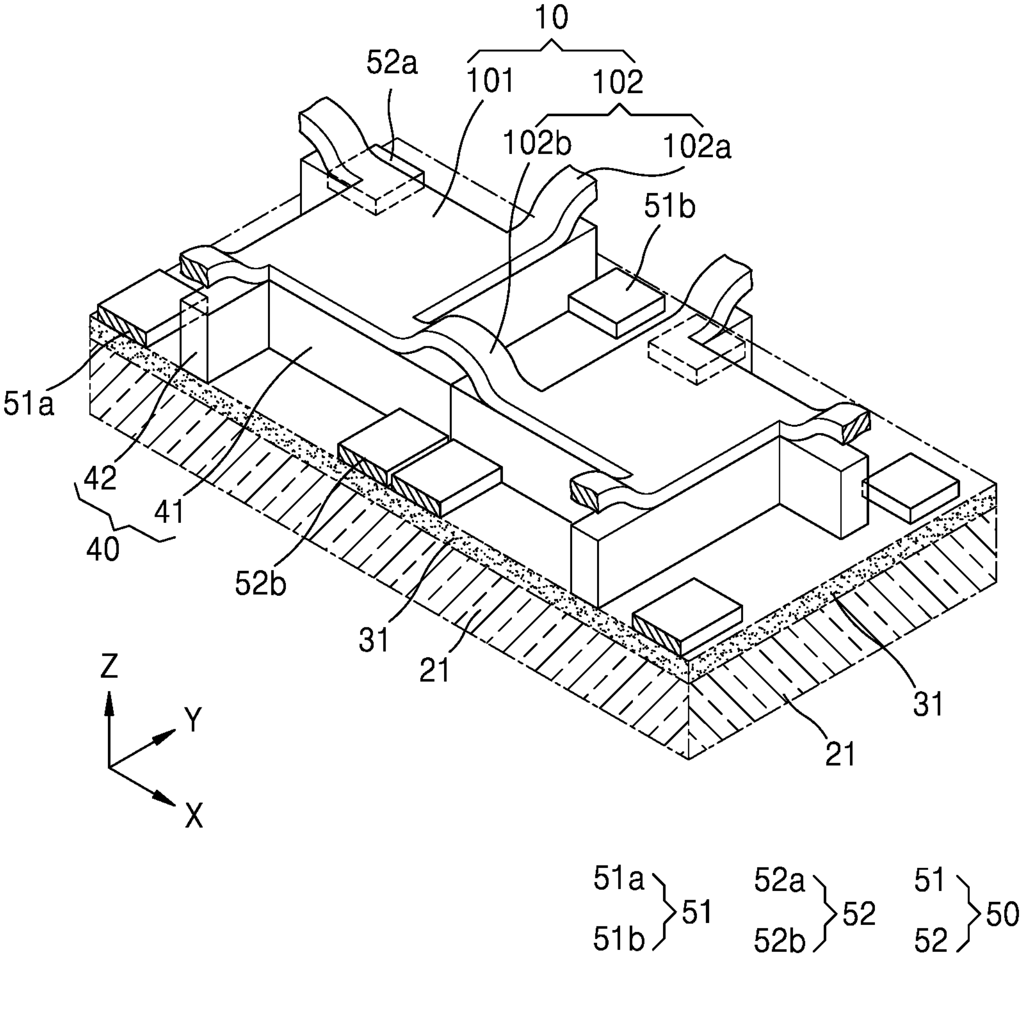
FIG. 8C is a perspective view showing a shape in which a portion of the display apparatus of FIG. 8A has contracted.
Figure 8D:
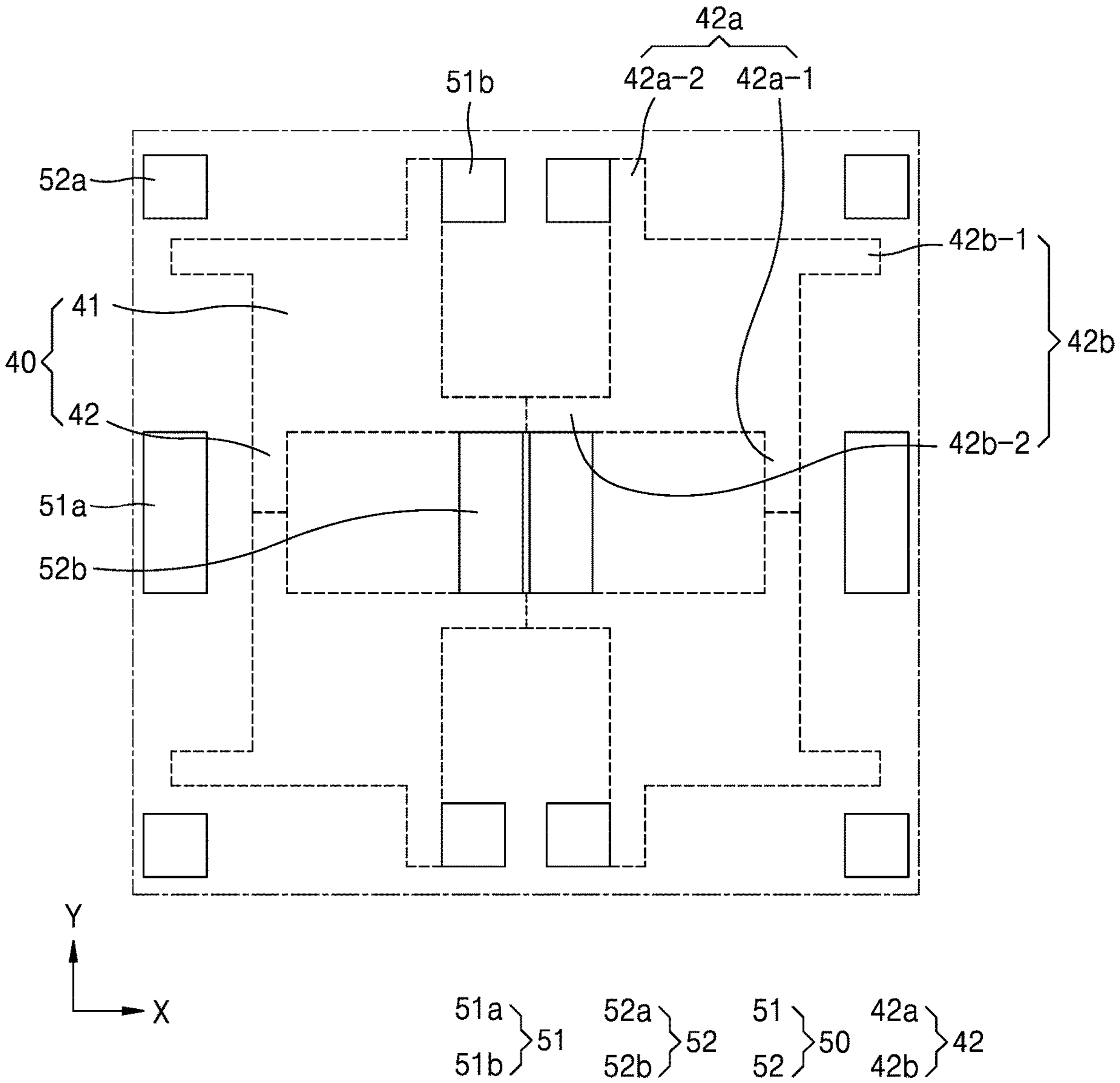
FIG. 8D is a plan view of a portion of the display apparatus of FIG. 8C.

FIG. 8C is a perspective view showing a shape in which a portion of the display apparatus of FIG. 8A has contracted. FIG. 8D is a plan view of a portion of the display apparatus of FIG. 8C.

Referring to FIGS. 8C and 8D, when heat is applied to a display apparatus, at least one of the first member 21 and a second member (not shown) may contract by the heat. In this case, a distance between the display areas 101 adjacent to each other in at least one of a first direction and a second direction may be smaller than an initial distance. In an embodiment, a shape of the bridge area 102 connecting together the display areas 101 adjacent to each other may change. Hereinafter, for convenience of description, a case where when heat is applied to the display apparatus, both the first member 21 and the second member contract, and the display apparatus contracts in both the first direction and the second direction will be mainly described in detail.

In this case, the support member 40 may be arranged at a position different from an initial position according to the contraction of the first member 21 and the second member. In an embodiment, for example, a distance between the support members 40 apart from each other in the first direction may be smaller than an initial distance, and a distance between the support members 40 apart from each other in the second direction may be smaller than an initial distance.

In this case, due to a difference in contraction between one area of the display apparatus where the support member 40 is arranged and the other area of the display apparatus where the support member 40 is not arranged, the first-first stopper unit 51*a* may be apart from the first-first protrusion portion 42*a*-1, and the second-second stopper unit 52*b* may be in contact with or may be arranged in close proximity to the second-second protrusion portion 42*b*-2. In addition, the first-second stopper unit 51*b* and the first-second protrusion portion 42*a*-2 may be in contact with each other or may be arranged in close proximity to each other. In contrast, the second-first stopper unit 52*a* and the second-first protrusion portion 42*b*-1, which used to be in contact with each other, may be apart from each other. In this case, a distance between the first-first protrusion portion 42*a*-1 and the first-first stopper unit 51*a* may be greater than a distance between the first-second stopper unit 51*b* and the first-second protrusion portion 42*a*-2, a distance between the second-first protrusion portion 42*b*-1 and the second-first stopper unit 52*a*, and a distance between the second-second stopper unit 52*b* and the second-second protrusion portion 42*b*-2. In an embodiment, for example, a distance between the first-first protrusion portion 42*a*-1 and the first-first stopper unit 51*a* may be greater than a distance between the second-first protrusion portion 42*b*-1 and the second-first stopper unit 52*a*. In addition, a distance between the first-first protrusion portion 42*a*-1 and the first-first stopper unit 51*a* may be greater than a distance between the second-second protrusion portion 42*b*-2 and the second-second stopper unit 52*b*. A distance between the first-first protrusion portion 42*a*-1 and the first-first stopper unit 51*a* may be greater than a distance between the first-second protrusion portion 42*a*-2 and the first-second stopper unit 51*b*. In an embodiment, a distance between each protrusion portion and each stopper unit may refer to a distance between one side surface of each protrusion portion and one side surface of each stopper unit, facing each other.

In such an embodiment, when the display apparatus contracts, the stopper unit may effectively prevent or substantially reduce rotation of the support member 40, thereby reducing displacement of the display area 101 disposed on the support member 40.

Figure 9A:
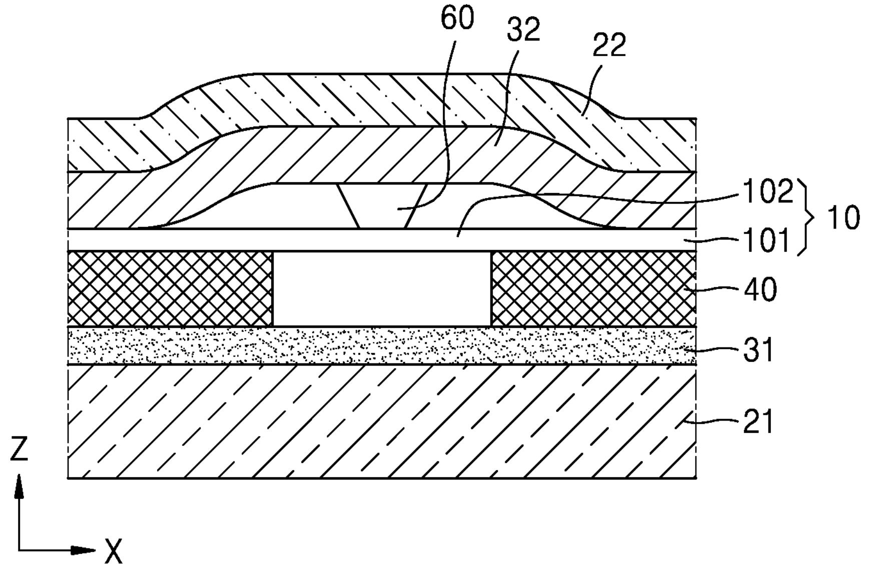
FIG. 9A is a cross-sectional view of a portion of a display apparatus according to another embodiment.
Figure 9B:
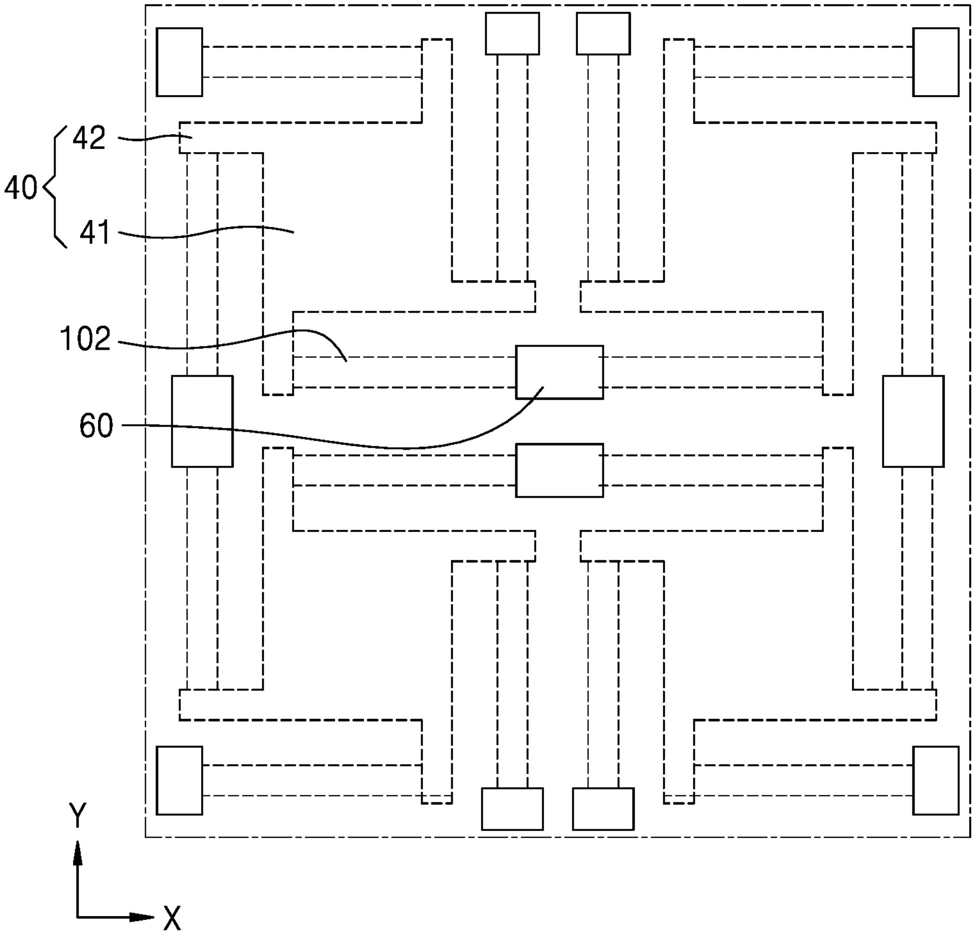
FIG. 9B is a plan view of a portion of the display apparatus of FIG. 9A.

FIG. 9A is a cross-sectional view of a portion of a display apparatus according to another embodiment. FIG. 9B is a plan view of a portion of the display apparatus of FIG. 9A.

Referring to FIGS. 9A and 9B, the first member 21, the first adhesive member 31, the support member 40, the display panel 10, the second adhesive member 32, the second member 22, and a force applicator 60 may be included in a display apparatus according to an embodiment. In such an embodiment, the first member 21, the first adhesive member 31, the support member 40, the second adhesive member 32, and the second member 22 are the same as or similar to those described with reference to FIG. 3, and thus any repetitive detailed descriptions thereof will be omitted.

The display panel 10 may include the display area 101 and the bridge area 102. In an embodiment, a unit of the display panel 10 may be the same as or similar to that shown in FIGS. 2B and 4B.

In such an embodiment, the force applicator 60 may protrude from the second adhesive member 32 to the bridge area 102, and may be disposed on the second adhesive member 32 and may be in contact with the bridge area 102 to apply a force to the bridge area 102. In an embodiment, the force applicator 60 may be arranged in a central portion of the bridge area 102. The force applicator 60 may include a material the same as or similar to that of at least one selected from the support member 40 and the stopper unit described with reference to FIG. 3.

The force applicator 60 may be arranged only in the bridge area 102 where deformation occurs. The arrangement of the force applicator 60 shown in FIG. 9B is directed to a case where a display apparatus is deformed in both a first direction and a second direction. In an embodiment, when the display apparatus is deformed only in the first direction or the second direction, the force applicator 60 may be disposed on the bridge area 102 whose shape changes according to a direction in which the display apparatus is deformed.

Figure 9C:
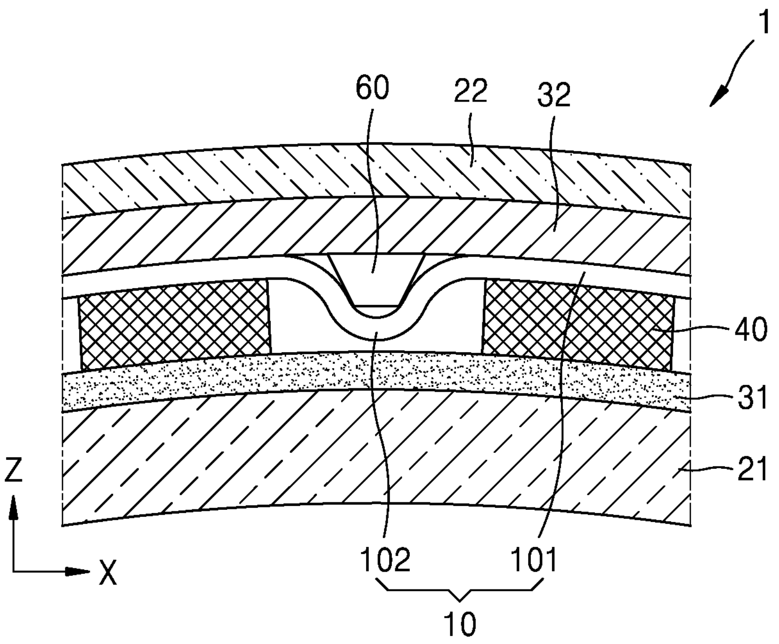
FIG. 9C is a cross-sectional view showing a shape in which a portion of the display apparatus of FIG. 9A has contracted.
Figure 9D:
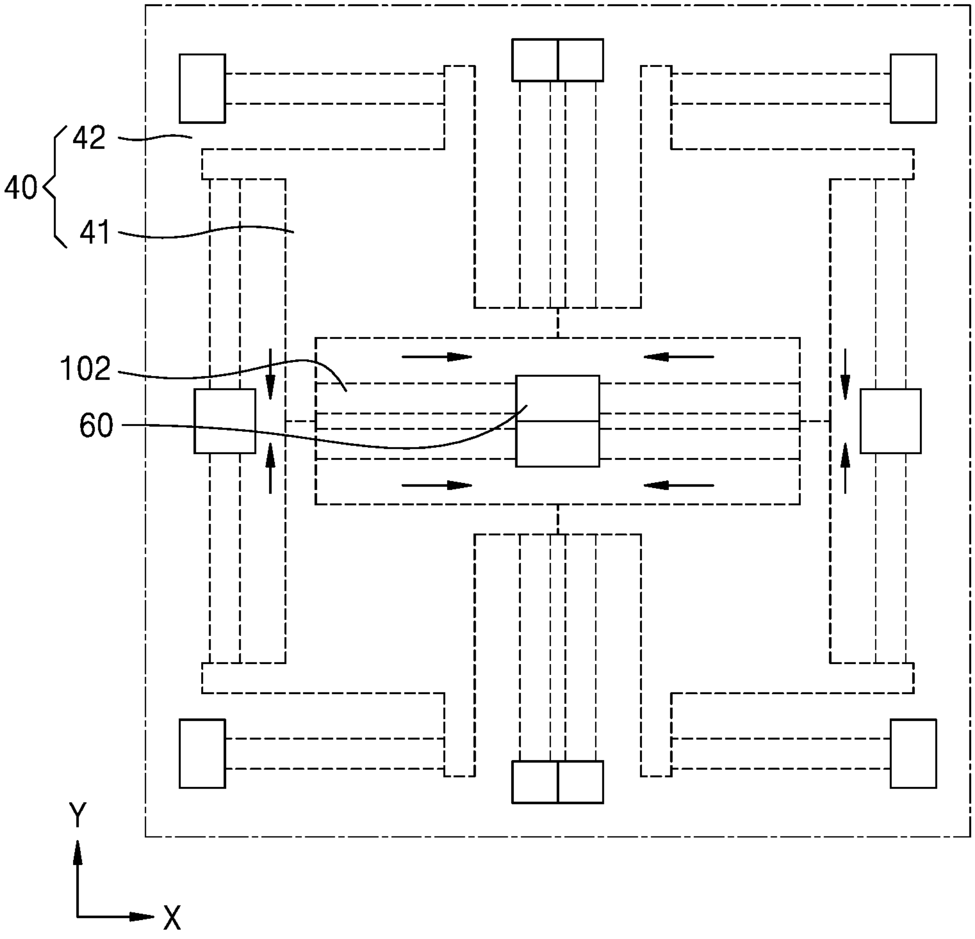
FIG. 9D is a plan view of a portion of the display apparatus of FIG. 9C.

FIG. 9C is a cross-sectional view showing a shape in which a portion of the display apparatus of FIG. 9A has contracted. FIG. 9D is a plan view of a portion of the display apparatus of FIG. 9C.

Referring to FIGS. 9C and 9D, when heat is applied to the display apparatus 1, at least one of the first member 21 and the second member 22 may contract. In an embodiment, the display apparatus 1 may contract in at least one of the first direction and the second direction. Hereinafter, for convenience of description, a case where the display apparatus 1 contracts in the first direction and the second direction will be mainly described in detail. In addition, in this case, the display panel 10 exhibits a movement similar to that described with reference to FIGS. 8C and 8D, and thus any repetitive detailed descriptions thereof will be omitted.

In this case, that is, when display areas 101 adjacent to each other among the plurality of display areas 101 come closer to each other, the force applicator 60 may apply a force to the central portion of the bridge area 102 toward the first member 21. In an embodiment, the bridge area 102 may descend in a direction toward the first member 21 (for example, in a direction toward a lower side of FIG. 9C)

while forming an arch. In addition, a thickness of the force applicator 60 is greater than a thickness of the display panel 10, and thus when the force applicator 60 applies a force to the bridge area 102 in a direction toward the first member 21, a portion of the force applicator 60 may enter between the support members 40. In this case, when the support member 40 is about to rotate during contraction of the first member 21 and the second member 22, the force applicator 60 comes into contact with the support member 40 so that rotation of the support member 40 may be effectively prevented. In particular, the force applicator 60 is arranged to overlap a movement path of each of the protrusion portions 42 of the support member 40 so that rotation of the support member 40 may be effectively prevented or substantially reduced.

In such an embodiment, even when the display apparatus contracts, rotation of the support member 40 may be effectively prevented or substantially reduced, thereby reducing displacement of the display area 101 disposed on the support member 40.

In such an embodiment, the stopper unit may be arranged in addition to the force applicator 60. In an embodiment, the stopper unit may be disposed on the first adhesive member 31 according to a direction in which the display apparatus is deformed, as described above.

Figure 10A:
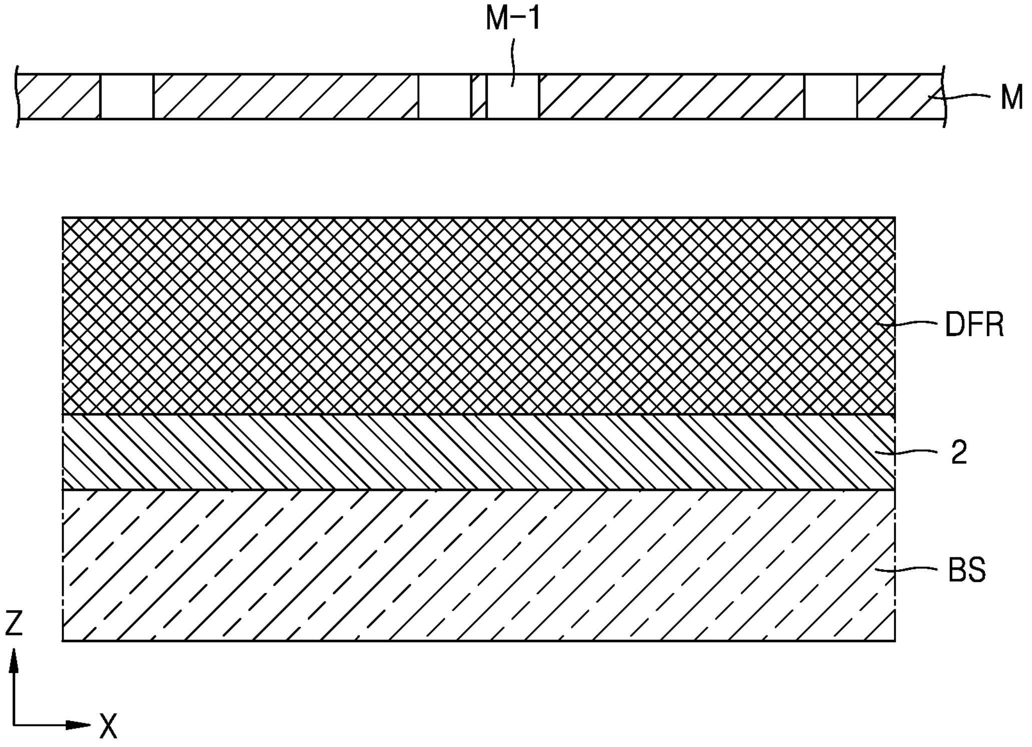
FIGS. 10A to 10C are cross-sectional views showing a procedure for manufacturing a portion of a display apparatus according to embodiments.
Figure 10B:
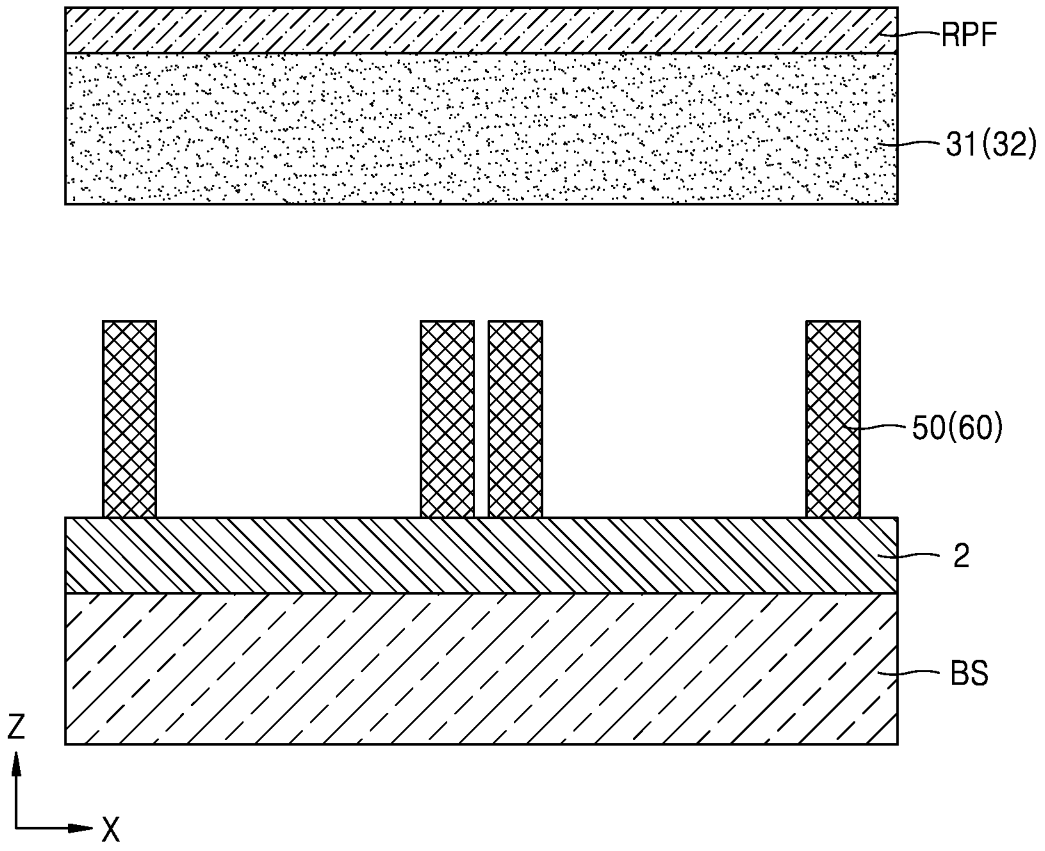
Figure 10C:
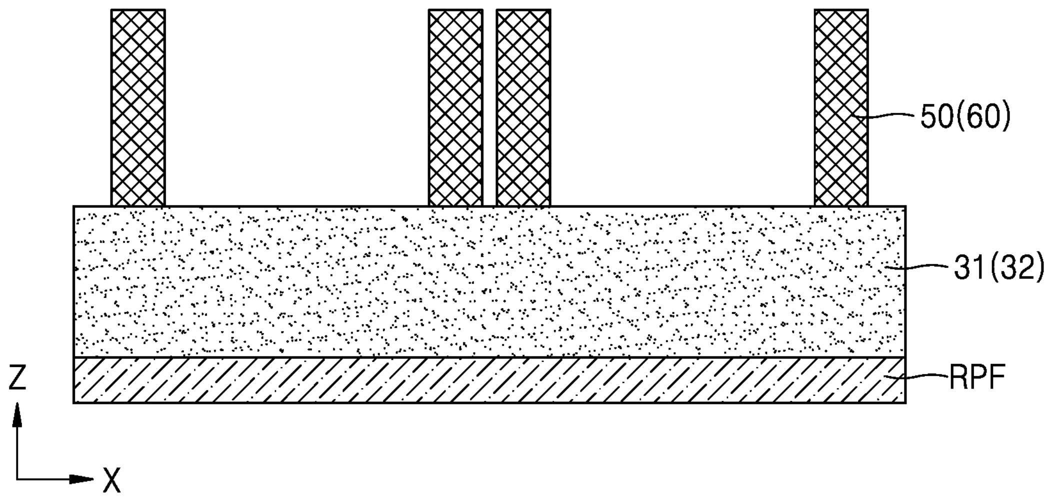

FIGS. 10A to 10C are cross-sectional views showing a procedure for manufacturing a portion of a display apparatus according to embodiments.

Referring to FIGS. 10A to 10C, in an embodiment, the stopper unit 50 may be disposed on the first adhesive member 31, or the force applicator 60 may be disposed on the second adhesive member 32. In an embodiment, a method of arranging the stopper unit 50 on the first adhesive member 31 and a method of arranging the force applicator 60 on the second adhesive member 32 are the same as or similar to each other. Thus, for convenience of description, embodiments of a method for disposing the stopper unit 50 on the first adhesive member 31 will be mainly described in detail.

Referring to FIG. 10A, an adhesive film 2 may be disposed (formed or provided) on a base substrate BS, and a stopper member DFR may be disposed on the adhesive film 2. In an embodiment, the adhesive film 2 may include polydimethylsiloxane (PDMS), and the stopper member DFR may include a photoresist and/or a dry film photoresist.

After a mask M provided with an opening M-1 is prepared and disposed to face the stopper member DFR, ultraviolet rays may be supplied onto the mask M via a light source. In this case, except for portions of the stopper member DFR, to which the ultraviolet rays have reached through the opening M-1, the rest of the stopper member DFR is removed with a separate liquid chemical so that only the stopper unit 50 may be disposed on the adhesive film 2.

Referring to FIG. 10B, the first adhesive member 31 may be arranged to face the stopper unit 50. In an embodiment, the first adhesive member 31 may be in a state where a cover film RPF is disposed thereon.

Referring to FIG. 10C, the stopper unit 50 may be separated from the adhesive film 2 by bonding the first adhesive member 31 to the stopper unit 50.

Although not shown, the support member 40 may be disposed on the first adhesive member 31 while the above process is in progress. In another embodiment, the support member 40 may be disposed on the first adhesive member 31 after the above process is completed. In another embodiment, the support member 40 may be disposed on a lower surface of the display panel 10 and then disposed on the first adhesive member 31 together with the display panel 10. In another embodiment, although not shown, when the stopper unit 50 is formed, the support member 40 may be formed at the same time as the stopper unit 50 is formed, and may be disposed on the first adhesive member 31.

Figure 11A:
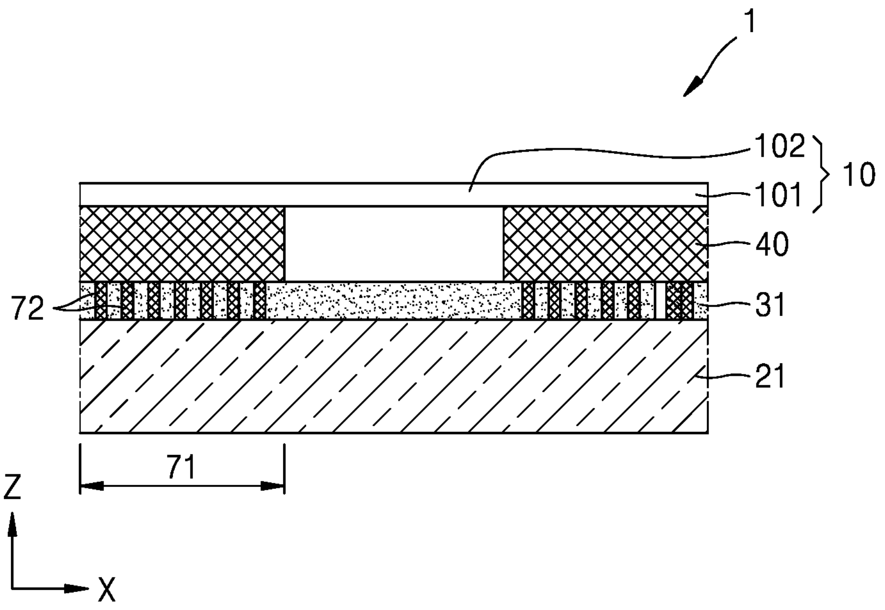
FIG. 11A is a schematic cross-sectional view of a portion of a display apparatus according to another embodiment.
Figure 11B:
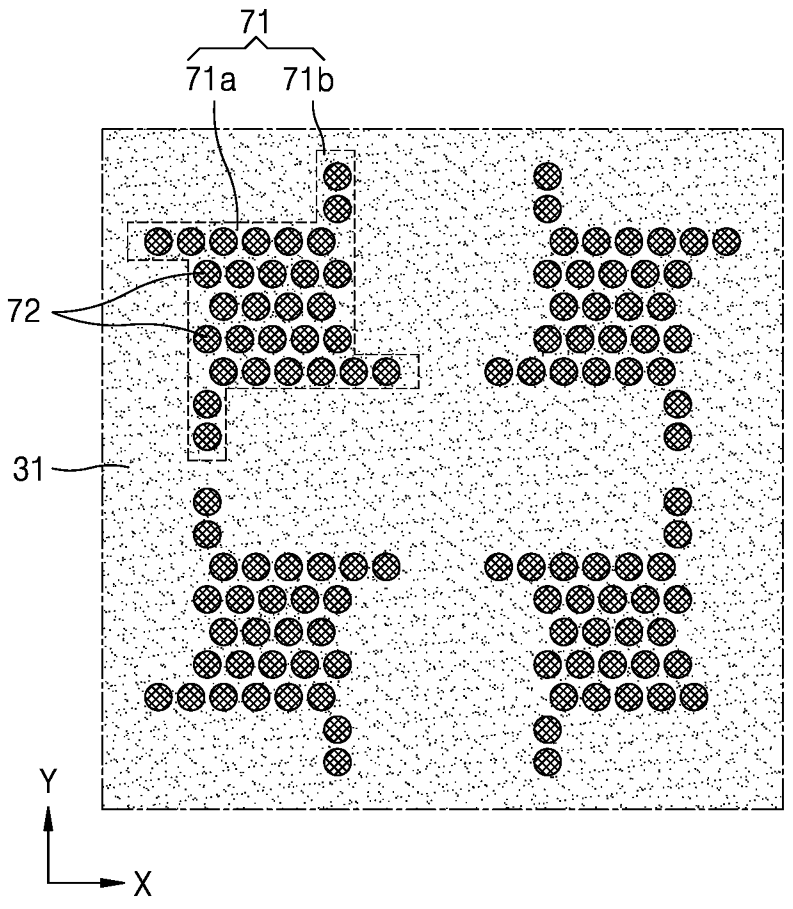
FIG. 11B is a schematic plan view of a portion of the display apparatus of FIG. 11A.
Figure 11C:
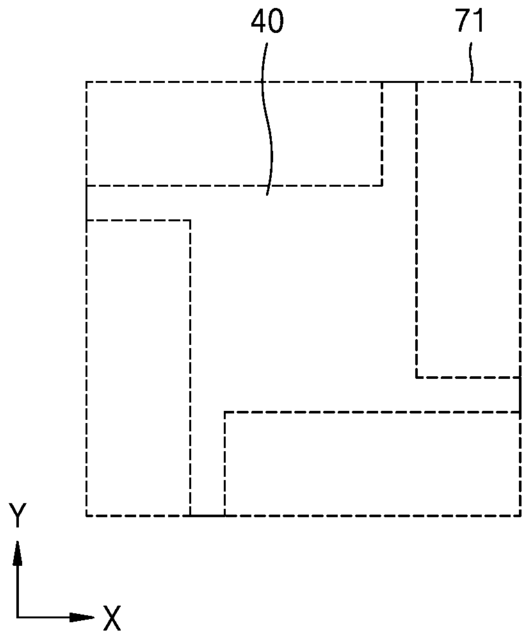
FIG. 11C is a plan view showing positions of an island area and a support member shown in FIG. 11A.
Figure 11D:
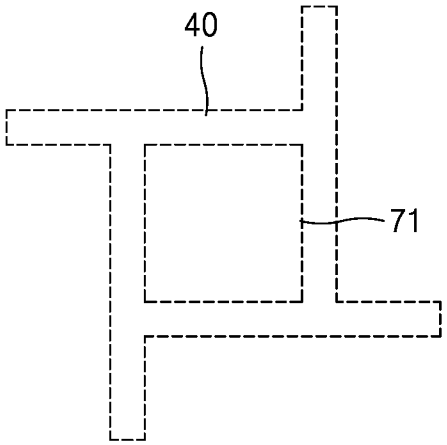
FIG. 11D is a plan view showing positions of the island area and the support member shown in FIG. 11A.

FIG. 11A is a schematic cross-sectional view of a portion of a display apparatus according to another embodiment. FIG. 11B is a schematic plan view of a portion of the display apparatus of FIG. 11A. FIG. 11C is a plan view showing positions of an island area and a support member shown in FIG. 11A. FIG. 11D is a plan view showing positions of the island area and the support member shown in FIG. 11A.

Referring to FIGS. 11A to 11D, an embodiment of the display apparatus 1 may display panel 10, the second adhesive member 32, and the second member 22. In such an embodiment, the first member 21, the support member 40, the display panel 10, the second adhesive member 32, and the second member 22 are the same as or similar to those described with reference to FIG. 3, and thus any repetitive detailed descriptions thereof will be omitted.

The first adhesive member 31 may include an island area 71 having a different modulus of elasticity from that of another area of the first adhesive member 31. In an embodiment, for example, a modulus of elasticity of the island area 71 may be greater than a modulus of elasticity of another area of the first adhesive member 31 excluding the island area 71.

In such an embodiment, adhesion of another area of the first adhesive member 31 excluding the island area 71 may be different from adhesion of the island area 71. In an embodiment, for example, an adhesion of another area of the first adhesive member 31 excluding the island area 71 may be less than an adhesion of the island area 71. In an embodiment, an adhesion of the island area 71 may be greater than or equal to about 3,000 gram-force per inch (g·f/inch). In a case where an adhesion of the island area 71 is less than about 3,000 g·f/inch, when the display apparatus 1 contracts, the support member 40 may rotate.

The island area 71 may include a core portion 72 defined therein. In an embodiment, the core portion 72 may have various shapes. In an embodiment, the core portion 72 may include a nanowire. In an embodiment, the core portion 72 may include silicon oxide ($SiO_2$), titanium dioxide ($TiO_2$), and/or zinc peroxide ($ZnO_2$). In another embodiment, the core portion 72 may be in the form of a nanoparticle. In an embodiment, the core portion 72 may include a nanoparticle of zinc peroxide, gold, and/or silver. Hereinafter, for convenience of description, embodiments where the core portion 72 is in the form of a nanowire will be mainly described in detail.

A plurality of core portions 72 may be provided under the support member 40, and may be arranged in a thickness direction of the first adhesive member 31. In an embodiment, when viewed in a plan view, an area of the island area 71 in which the core portion 72 is arranged may be less than or equal to an area of the support member 40. In such an embodiment, when viewed in a plan view, the core portion 72 is arranged inside the island area 71.

A planar shape of the island area 71 may vary. In an embodiment, for example, a planar shape of the island area 71 may be a quadrangular shape as shown in FIGS. 11C and 11D. In an embodiment, as shown in FIG. 11D, when viewed in a plan view, a planar shape of the island area 71 may overlap at least a portion of the display area 101 (for example, at least a portion of a body portion of the support member 40). In another embodiment, as shown in FIG. 11C, when viewed in a plan view, a planar shape of the island area 71 may overlap the entire display area 101 (for example, the entire body portion of the support member 40) and at least a portion of the bridge area 102 (for example, at least a portion of a protrusion portion of the support member 40). In such an embodiment, an end of the protrusion portion of the support member 40 may coincide with an edge of the planar shape of the island area 71, or may be arranged inside the planar shape of the island area 71.

In another embodiment, as shown in FIG. 11B, a planar shape of the island area 71 may be formed to correspond to a planar shape of the support member 40. In an embodiment, the island area 71 may include a first island area 71*a* disposed under the body portion 41 (see e.g., FIG. 6B) and a second island area 71*b* corresponding to the protrusion portion 42 (see e.g., FIG. 6B). In an embodiment, the first island area 71*a* may correspond to the display area 101, and the second island area 71*b* may protrude from the first island area 71*a* and overlap at least a portion of the bridge area 102.

A plurality of second island areas 71*b* may be provided. In an embodiment, when viewed in a plan view, a length of one of the plurality of second island areas 71*b* may be the same as a length of the corresponding protrusion portion 42. In another embodiment, a length of one of the plurality of second island areas 71*b* may be different from a length of the corresponding protrusion portion 42. In an embodiment, for example, although not shown, a length of one of the plurality of second island areas 71*b* may be smaller than a length of the corresponding protrusion portion 42. In an embodiment, a length of the second island area 71*b* may be smaller than a length of the bridge area 102 in a plan view.

One of the plurality of second island areas 71*b* may extend in a different direction from a direction in which another one of the plurality of second island areas 71*b* extend. In an embodiment, for example, the second island areas 71*b* may extend in different directions from each other. In an embodiment, a direction in which each of the second island areas 71*b* extends may be the same as or similar to an extension direction of the bridge area 102 shown in FIG. 2A or 2B.

The core portion 72 may be arranged in at least one of the first island area 71*a* and the second island area 71*b*. Hereinafter, for convenience of description, embodiments where the core portion 72 is arranged in both the first island area 71*a* and the second island area 71*b* will be mainly described in detail.

In an embodiment, the island area 71, in which the core portion 72 is arranged, effectively prevents or substantially reduce rotation of the support member 40 when the display apparatus 1 contracts, so that rotation of the display area 101 may be prevented.

In addition to the arrangement of the island area 71, the display apparatus may further include at least one selected from a stopper unit (not shown) and a force applicator (not shown).

Hereinafter, an embodiment of a method of manufacturing the island area 71 shown in FIG. 11B will be described in detail.

Figure 12A:
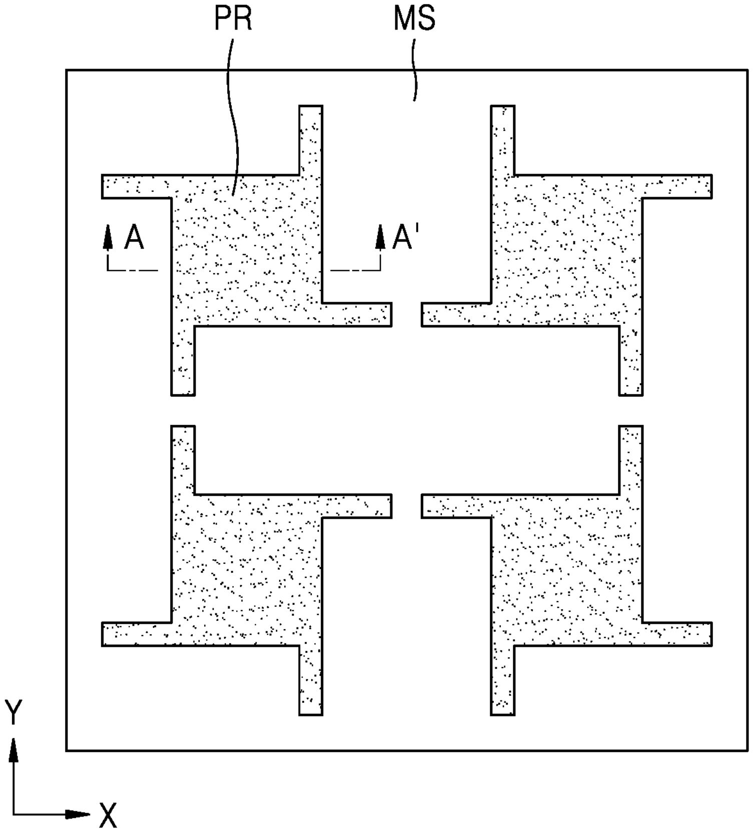
FIG. 12A is a plan view showing a manufacturing procedure for manufacturing a portion of the display apparatus of FIG. 11B.
Figure 12B:
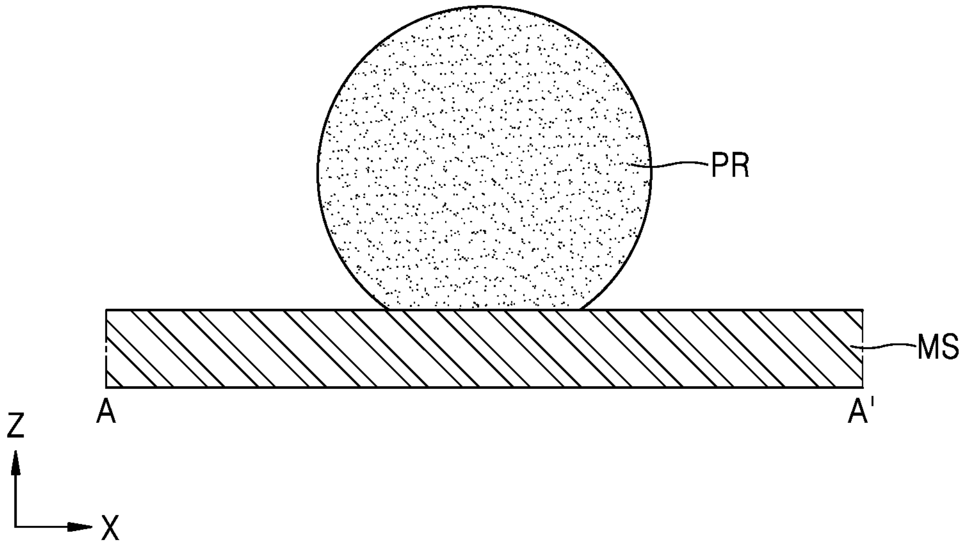
FIG. 12B is a cross-sectional view of the display apparatus taken along line A-A' of FIG. 12A.

FIG. 12A is a plan view showing a manufacturing procedure for manufacturing a portion of the display apparatus of FIG. 11B. FIG. 12B is a cross-sectional view of the display apparatus taken along line A-A' of FIG. 12A.

Referring to FIGS. 12A and 12B, after a base member MS is prepared, a photoresist pattern PR may be formed on the base member MS. In an embodiment, the base member MS may include a same material as that of the core portion 72.

Figure 12C:
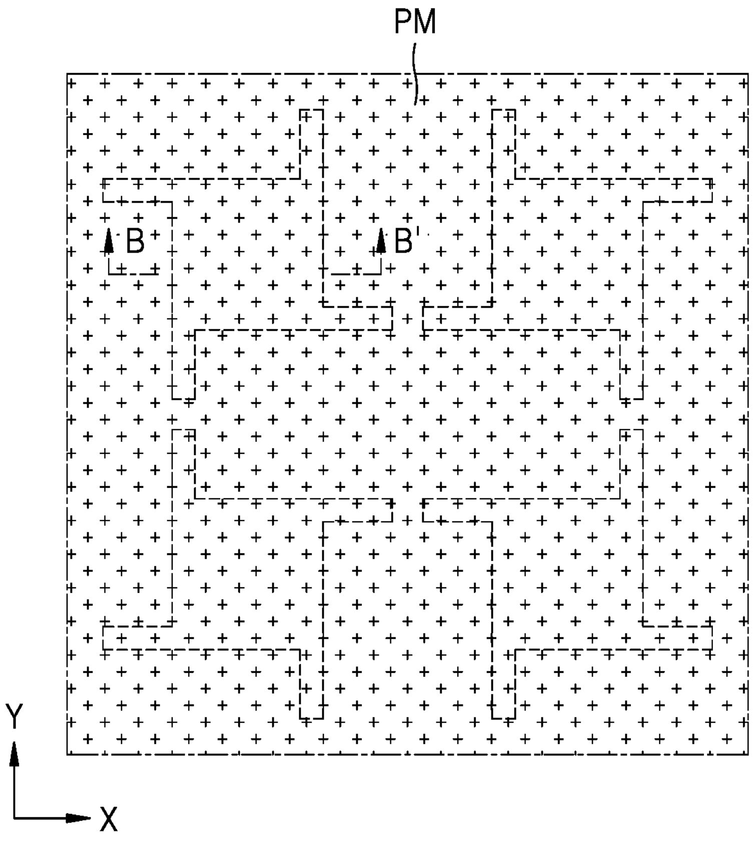
FIG. 12C is a plan view showing a manufacturing procedure for manufacturing a portion of the display apparatus of FIG. 11B.
Figure 12D:
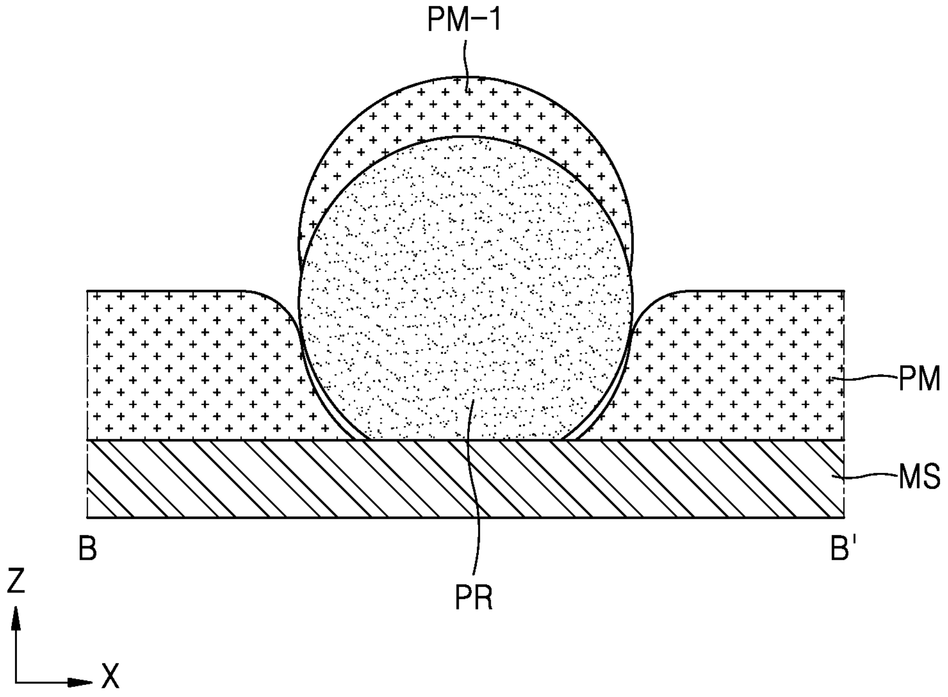
FIG. 12D is a cross-sectional view of the display apparatus taken along line B-B' of FIG. 12C.

FIG. 12C is a plan view showing a manufacturing procedure for manufacturing a portion of the display apparatus of FIG. 11B. FIG. 12D is a cross-sectional view of the display apparatus taken along line B-B' of FIG. 12C.

Referring to FIGS. 12C and 12D, a metal layer PM may be disposed on the base member MS on which the photoresist pattern PR is formed. In an embodiment, the metal layer PM may include silver and/or gold.

When the above process is completed, the metal layer PM may be disposed on the base member MS, and a dummy metal layer PM-1 may be disposed on the photoresist pattern PR.

Figure 12E:
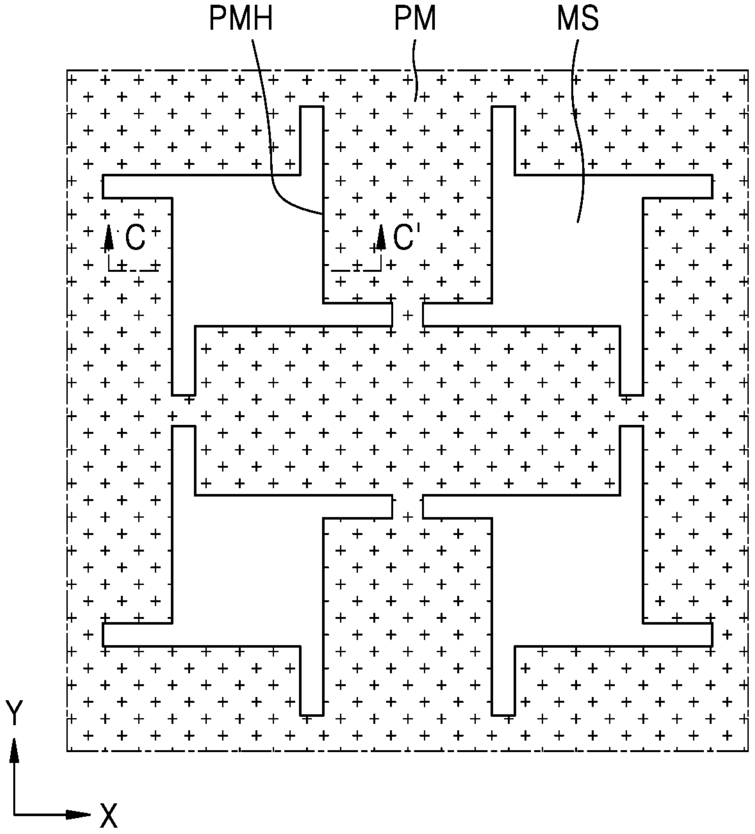
FIG. 12E is a plan view showing a manufacturing procedure for manufacturing a portion of the display apparatus of FIG. 11B.
Figure 12F:
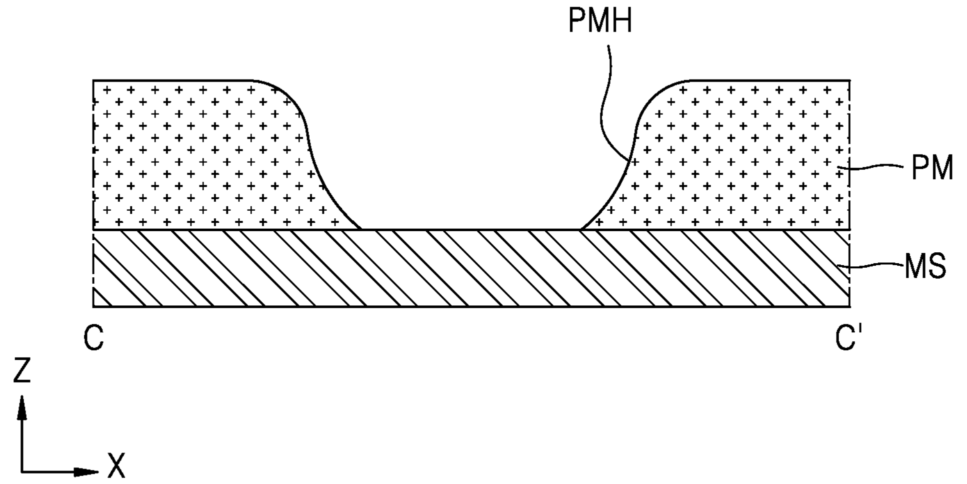
FIG. 12F is a cross-sectional view of the display apparatus taken along line C-C' of FIG. 12E.

FIG. 12E is a plan view showing a manufacturing procedure for manufacturing a portion of the display apparatus of FIG. 11B. FIG. 12F is a cross-sectional view of the display apparatus taken along line C-C' of FIG. 12E.

Referring to FIGS. 12E and 12F, the photoresist pattern PR may be removed from the base member MS on which the metal layer PM and the dummy metal layer PM-1 are formed. In an embodiment, as the photoresist pattern PR is removed, the dummy metal layer PM-1 may also be removed. In this process, a first opening area PMH may be formed in the metal layer PM.

Figure 12G:
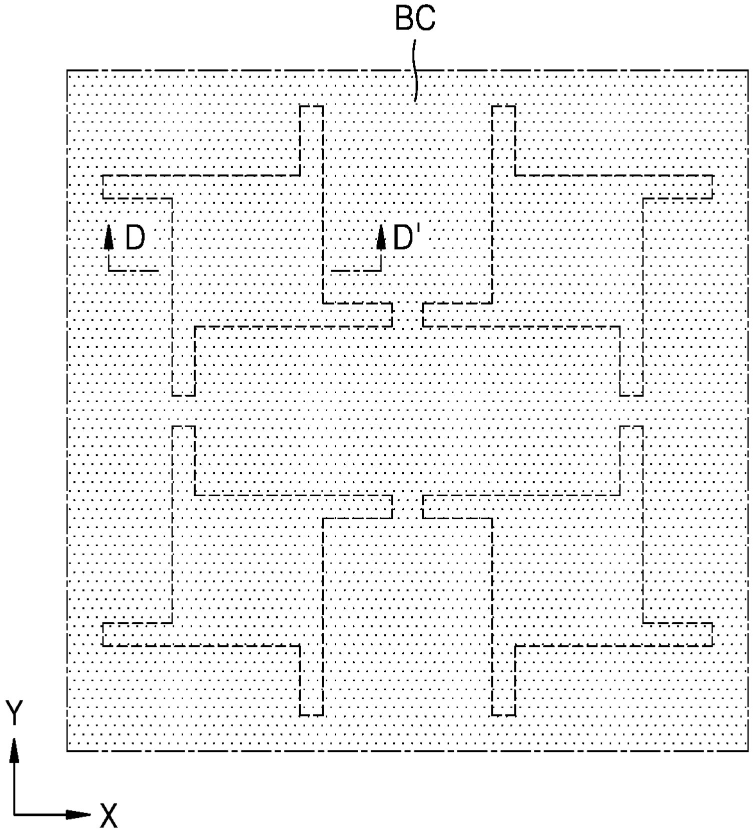
FIG. 12G is a plan view showing a manufacturing procedure for manufacturing a portion of the display apparatus of FIG. 11B.
Figure 12H:
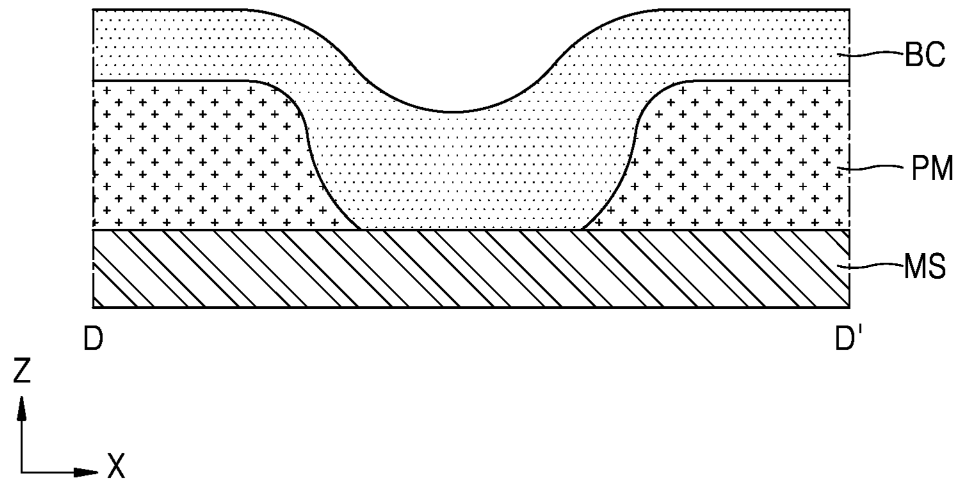
FIG. 12H is a cross-sectional view of the display apparatus taken along line D-D' of FIG. 12G.

FIG. 12G is a plan view showing a manufacturing procedure for manufacturing a portion of the display apparatus of FIG. 11B. FIG. 12H is a cross-sectional view of the display apparatus taken along line D-D' of FIG. 12G.

Referring to FIGS. 12G and 12H, a block copolymer (BCP) layer BC may be disposed on the metal layer PM in which the first opening area PMH is formed. In an embodiment, the BCP layer BC may be arranged inside the first opening area PMH and may be disposed on the metal layer PM. In an embodiment, the BCP layer BC may include PS and PMMA.

Figure 12I:
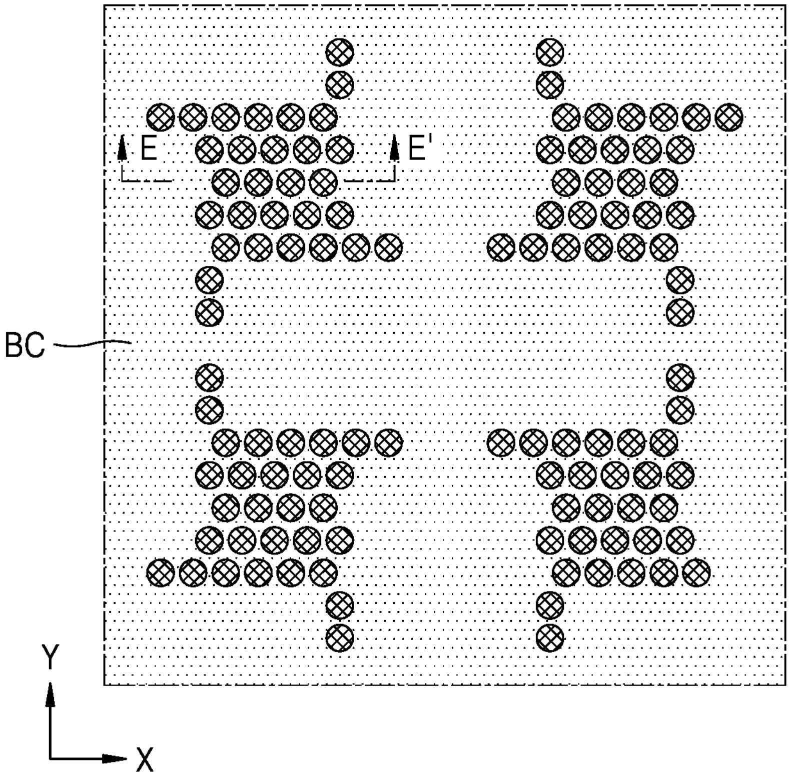
FIG. 12I is a plan view showing a manufacturing procedure for manufacturing a portion of the display apparatus of FIG. 11B.
Figure 12J:
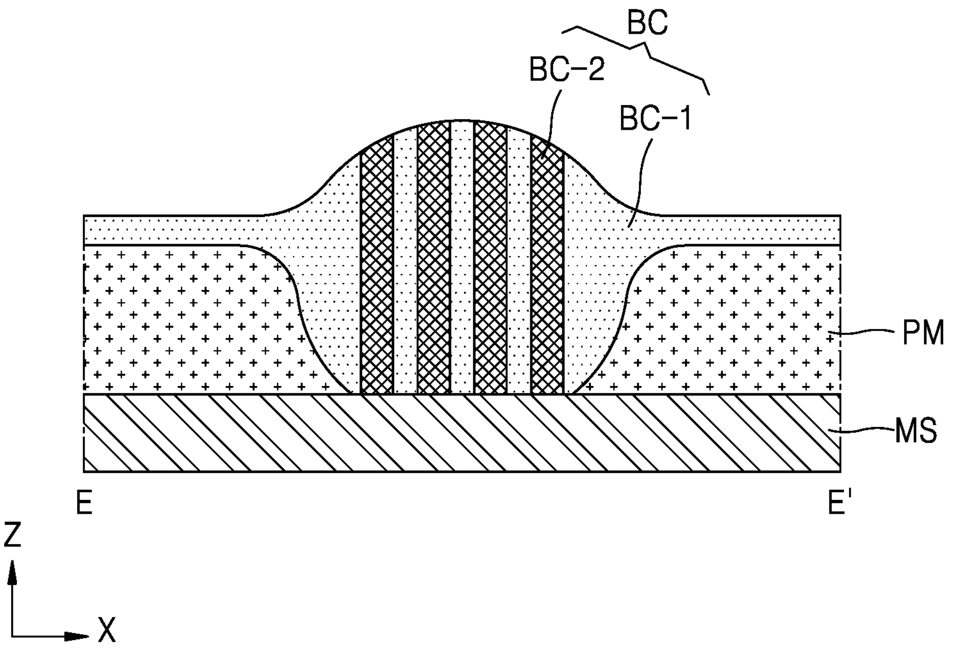
FIG. 12J is a cross-sectional view of the display apparatus taken along line E-E' of FIG. 12I.

FIG. 12I is a plan view showing a manufacturing procedure for manufacturing a portion of the display apparatus of FIG. 11B. FIG. 12J is a cross-sectional view of the display apparatus taken along line E-E' of FIG. 12I.

Referring to FIGS. 12I and 12J, heat may be applied to the BCP layer BC arranged in the first opening area PMH. In an embodiment, the BCP layer BC arranged in the first opening area PMH may be separated into a first layer BC-1 and a second layer BC-2 which is partially cured. The first layer BC-1 and the second layer BC-2 may include different materials from each other. In an embodiment, for example, the first layer BC-1 may include PS, and the second layer BC-2 may include PMMA. In this process, the second layer BC-2 may have various shapes, such as a sphere, a pillar, or an atypical shape.

Figure 12K:
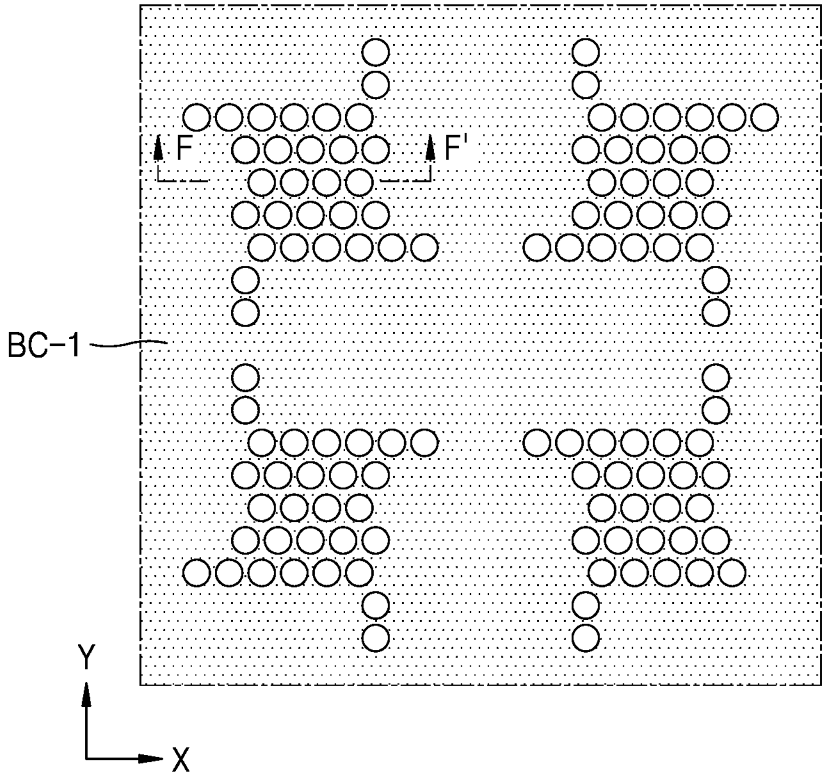
FIG. 12K is a plan view showing a manufacturing procedure for manufacturing a portion of the display apparatus of FIG. 11B.
Figure 12L:
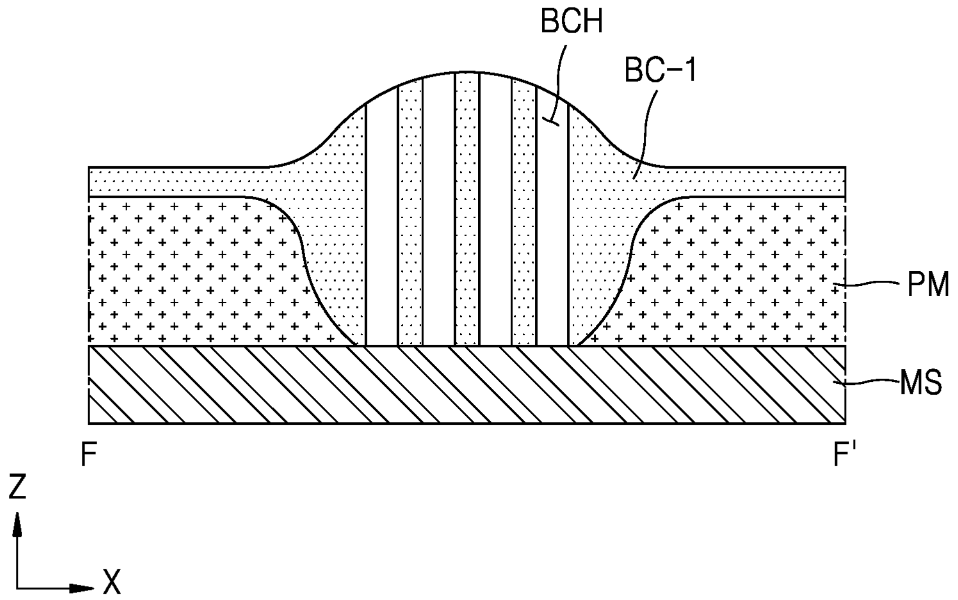
FIG. 12L is a cross-sectional view of the display apparatus taken along line F-F' of FIG. 12K.

FIG. 12K is a plan view showing a manufacturing procedure for manufacturing a portion of the display apparatus of FIG. 11B. FIG. 12L is a cross-sectional view of the display apparatus taken along line F-F' of FIG. 12K.

Referring to FIGS. 12K and 12L, the second layer BC-2 may be selectively removed by supplying ultraviolet rays and a liquid chemical to the first opening area PMH. In this process, a second opening area BCH may be formed in a portion where the second layer BC-2 is removed. In an embodiment, a shape of the second opening area BCH may be the same as a shape of the second layer BC-2.

Figure 12M:
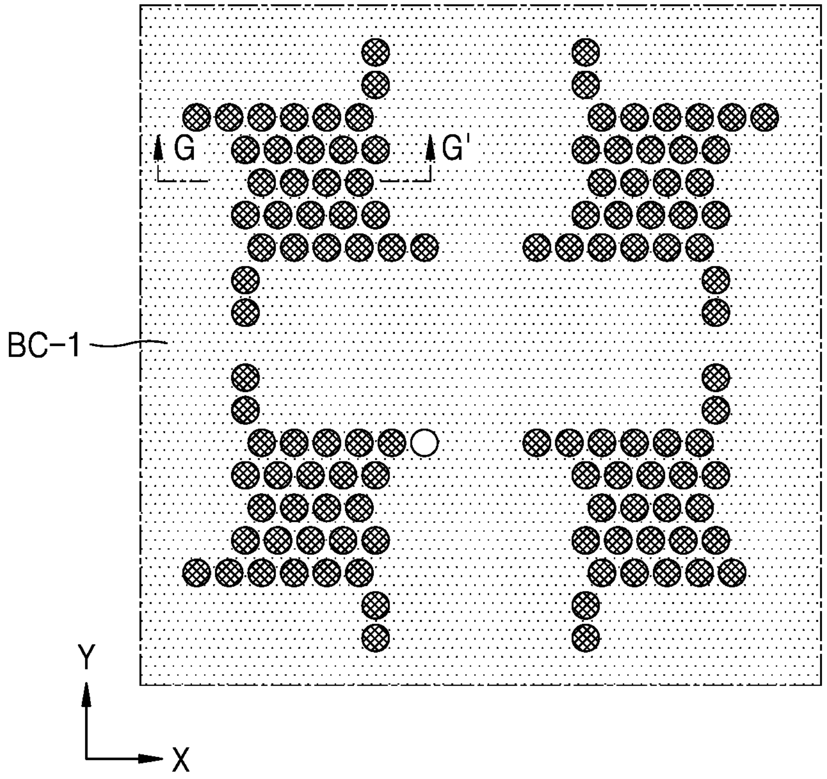
FIG. 12M is a plan view showing a manufacturing procedure for manufacturing a portion of the display apparatus of FIG. 11B.
Figure 12N:
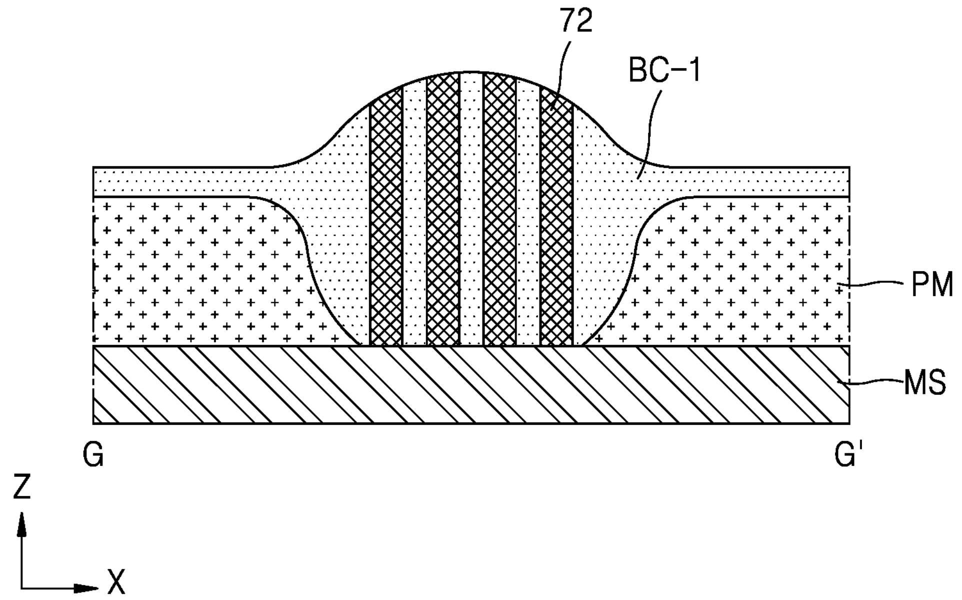
FIG. 12N is a cross-sectional view of the display apparatus taken along line G-G' of FIG. 12M.
Figure 120:
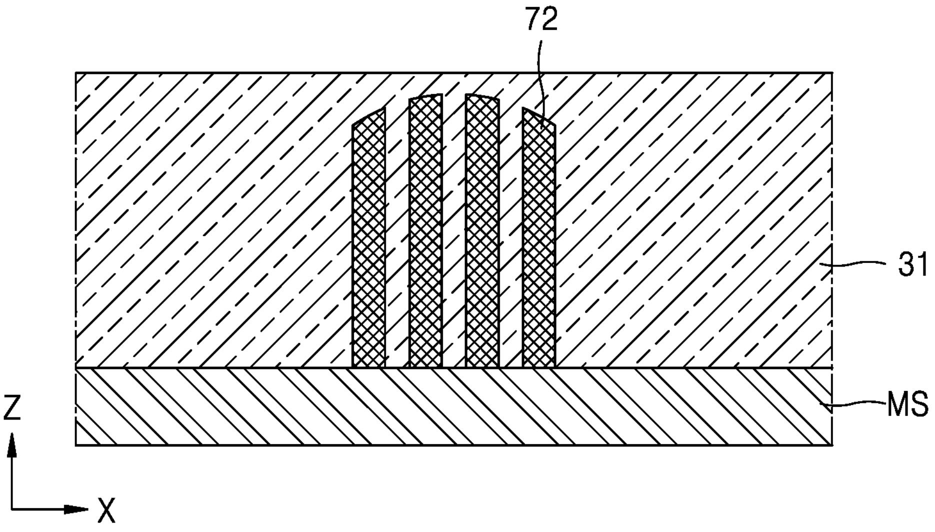

FIG. 12M is a plan view showing a manufacturing procedure for manufacturing a portion of the display apparatus of FIG. 11B. FIG. 12N is a cross-sectional view of the display apparatus taken along line G-G' of FIG. 12M.

Referring to FIGS. 12M and 12N, the core portion 72 may be formed in the second opening area BCH by providing a source material to the second opening area BCH. In an embodiment, the source material may vary depending on a material of the core portion 72.

Figure 12P:
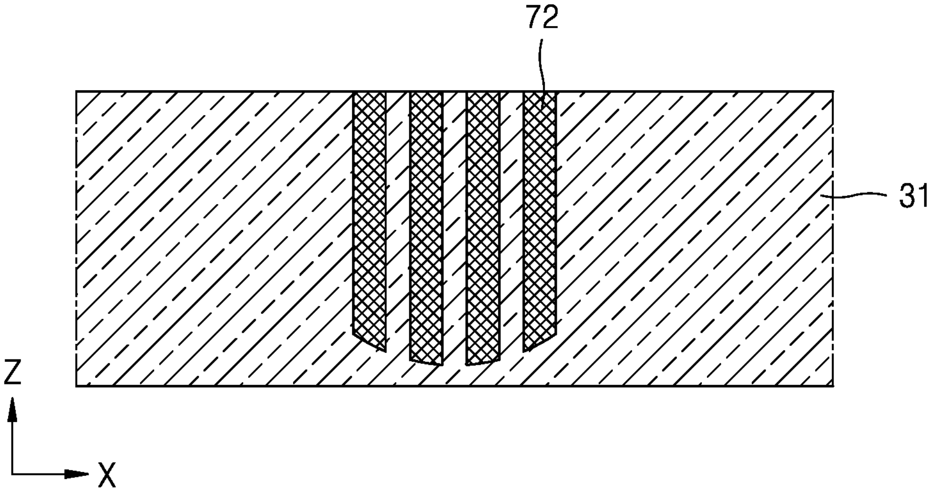

FIGS. 12O and 12P are cross-sectional views showing a manufacturing procedure for manufacturing a portion of the display apparatus of FIG. 11B.

Referring to FIGS. 12O and 12P, after the first layer BC-1 in which the core portion 72 is arranged is removed, the core portion 72 may be separated from the base member MS by the first adhesive member 31. In this process, the core portion 72 may be arranged inside the first adhesive member 31 or may be disposed on the first adhesive member 31.

In an embodiment, although not shown, where the core portion 72 includes a nanoparticle, the core portion 72 may be inserted into the first adhesive member 31 or may be disposed on the first adhesive member 31 via a polymer brush having a certain shape.

Figure 13A:
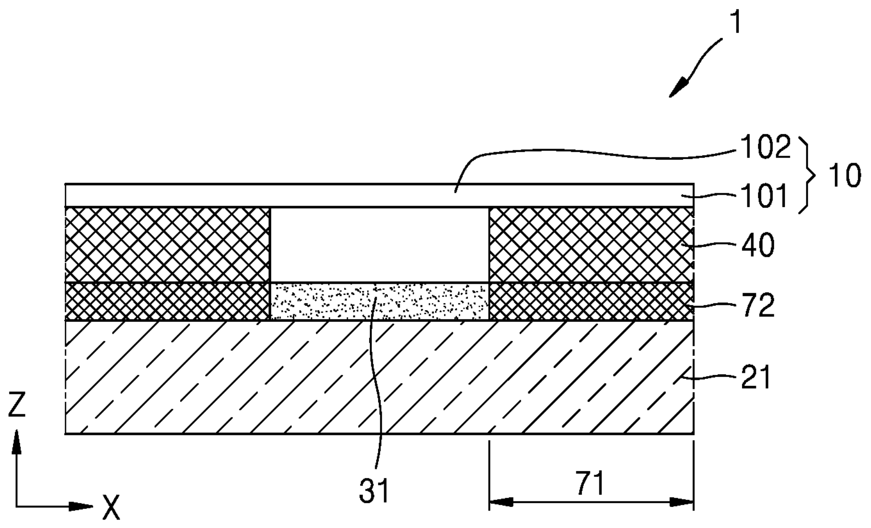
FIG. 13A is a schematic cross-sectional view of a portion of a display apparatus according to another embodiment.
Figure 13B:
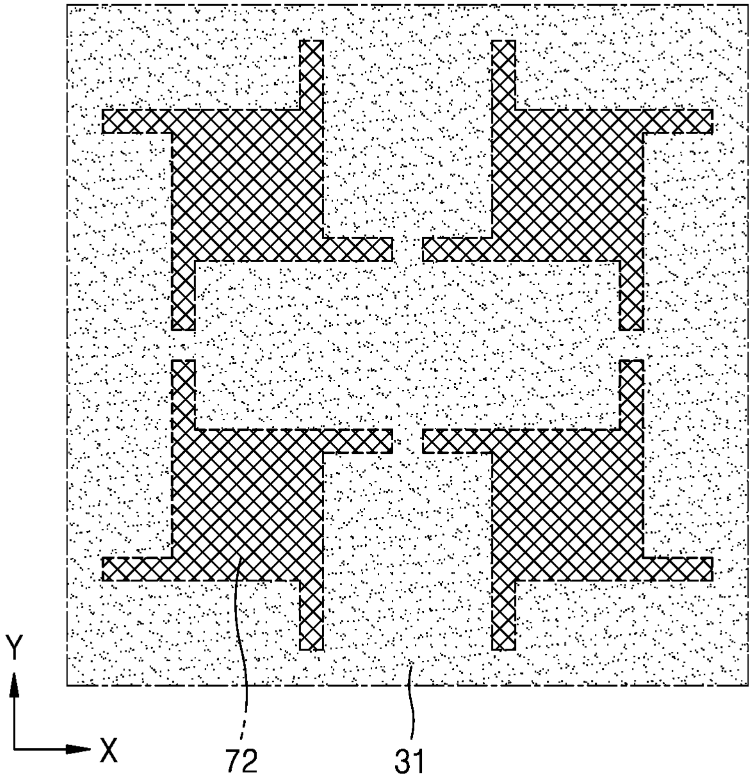
FIG. 13B is a plan view of a portion of the display apparatus of FIG. 13A.

FIG. 13A is a schematic cross-sectional view of a portion of a display apparatus according to another embodiment. FIG. 13B is a plan view of a portion of the display apparatus of FIG. 13A.

Referring to FIGS. 13A and 13B, an embodiment of the display apparatus 1 may display panel 10, the second adhesive member 32, and the second member 22. In such an embodiment, the first member 21, the support member 40, the display panel 10, the second adhesive member 32, and the second member 22 are the same as or similar to those described with reference to FIG. 3, and thus any repetitive detailed descriptions thereof will be omitted.

The first adhesive member 31 may include the island area 71 having a different modulus of elasticity from that of another area of the first adhesive member 31. In an embodiment, for example, a modulus of elasticity of the island area 71 may be greater than a modulus of elasticity of another area of the first adhesive member 31 excluding the island area 71.

In addition, adhesion of another area of the first adhesive member 31 excluding the island area 71 may be different from adhesion of the island area 71. In an embodiment, for example, an adhesion of another area of the first adhesive member 31 excluding the island area 71 may be smaller than an adhesion of the island area 71. In an embodiment, an adhesion of the island area 71 may be greater than or equal to about 3,000 g·f/inch. In a case where an adhesion of the island area 71 is less than about 3,000 g·f/inch, when the display apparatus 1 contracts, the support member 40 may rotate.

The island area 71 may include the core portion 72 therein. In an embodiment, the core portion 72 may include a metal. In an embodiment, for example, the core portion 72 may include gold and/or silver. In such an embodiment, the core portion 72 may have a shape same as or similar to that of the island area 71. In an embodiment, a planar shape of the core portion 72 may correspond to a planar shape of the support member 40.

The core portion 72 may be disposed on a surface of another portion of the first adhesive member 31 excluding the core portion 72 or may be inserted into the first adhesive member 31. In another embodiment, the core portion 72 may replace most of the first adhesive member 31 on which the support member 40 is disposed.

Figure 14:
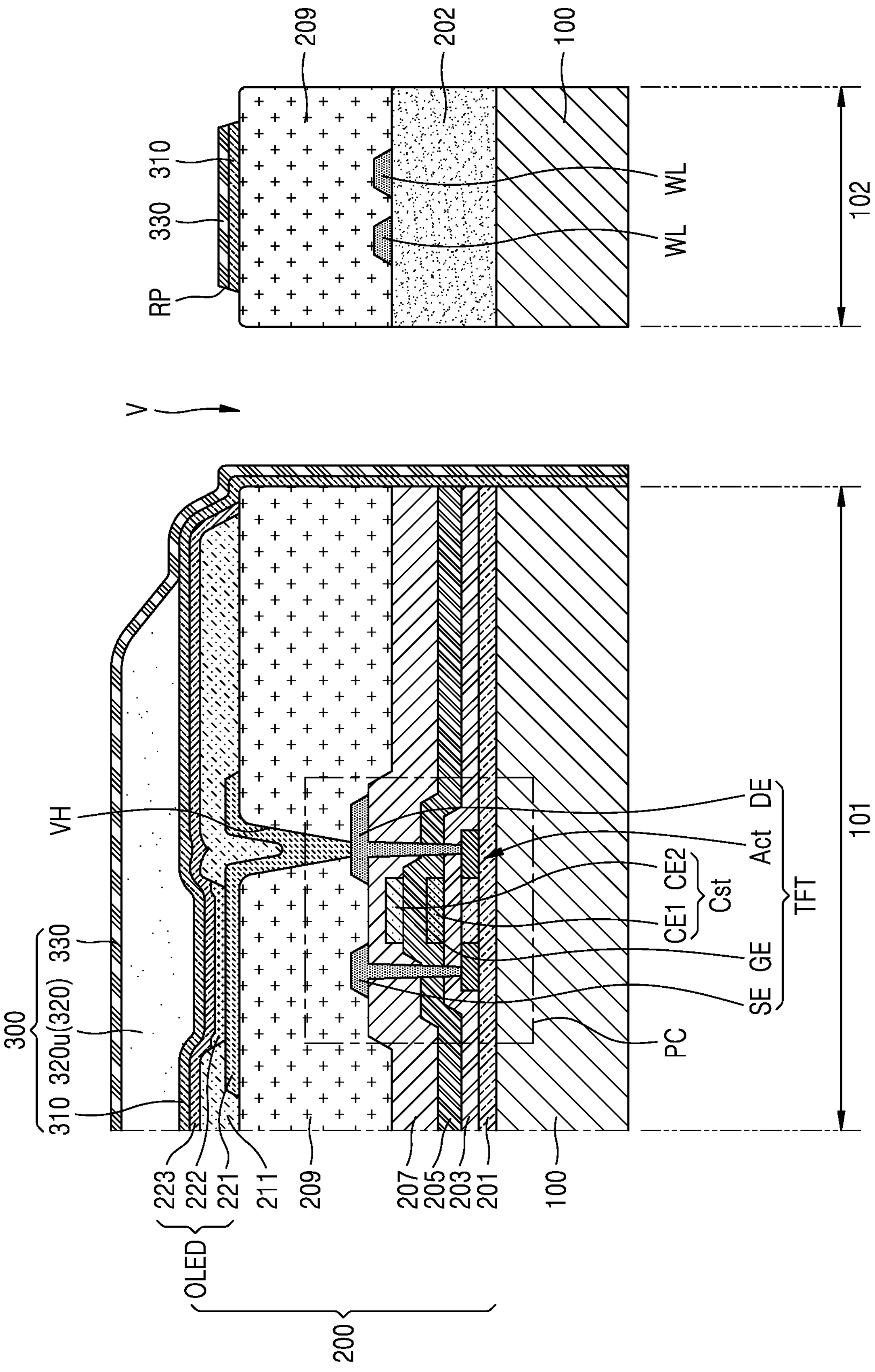
FIG. 14 is a schematic cross-sectional view of a portion of a display apparatus according to another embodiment.

FIG. 14 is a schematic cross-sectional view of a portion of a display apparatus according to another embodiment.

Referring to FIG. 14, an embodiment of the display apparatus may include a first member (not shown), a first adhesive member (not shown), a support member (not shown), a display panel, a second adhesive member (not shown), a second member (not shown), and a stopper unit (not shown). In such an embodiment, the first member, the first adhesive member, the support member, the display panel, the second adhesive member, the second member, and the stopper unit are similar to those described with reference to FIG. 3, and thus any repetitive detailed descriptions thereof will be omitted.

The display panel may include the plurality of display areas 101 and the plurality of bridge areas 102. In addition, the display panel includes the substrate 100, the unit display unit 200 including the planarization layer 209, and the encapsulation layer 300 sealing each unit display unit 200. In such an embodiment, the substrate 100, the unit display unit 200, and the encapsulation layer 300 are the same as or similar to those described with reference to FIG. 5, and thus any repetitive detailed descriptions thereof will be omitted.

The display panel may include the plurality of display areas 101 apart from each other, the plurality of bridge areas 102 connecting the plurality of display areas 101 together, and the plurality of through portions V arranged between the plurality of display areas 101 and the plurality of bridge areas 102 and penetrating the display panel, as shown in FIGS. 1 to 3. In an embodiment, the substrate 100 may be formed to correspond to the display area 101, the bridge area 102, and the through portion V.

The unit display units 200 are disposed on the substrate 100 in the plurality of display areas 101, respectively. In such an embodiment, the unit display unit 200 may refer to a set of display elements arranged in one display area 101. In an embodiment, the unit display unit 200 may include only one display element. In another embodiment, the unit display unit 200 may include a plurality of display elements representing red, green, and blue colors respectively.

The unit display unit 200 includes the planarization layer 209, and a display element, for example, the organic light-emitting diode OLED, may be disposed above the planarization layer 209. The planarization layer 209 may provide a flat upper surface in an area where the organic light-emitting diode OLED, which is a display element, is arranged.

The encapsulation layer 300 is disposed on the organic light-emitting diode OLED so that the organic light-emitting diode OLED may be protected from external air. The encapsulation layer 300 blocks external oxygen or moisture and may consist of or defined by a single layer or a plurality of layers. The encapsulation layer 300 may include at least one of an organic encapsulation layer and an inorganic encapsulation layer.

The wires WL may be disposed in the bridge area 102 to supply various signals and/or voltage to the unit display unit 200. The organic material layer 202 may be disposed below the wires WL, and the planarization layer 209 may be disposed above the wires WL.

The opposite electrode 223, the first inorganic encapsulation layer 310, and the second inorganic encapsulation layer 330 may be stacked above the planarization layer 209.

The bridge area 102 may have a smaller width than that of the display area 101 and thus may be vulnerable to stress caused by shape deformation of a display apparatus. Accordingly, cracks may occur in the wires WL arranged in the bridge area 102, and thus it is necessary to design so that a neutral plane is formed at positions of the wires WL.

In an embodiment, a recess pattern RP may be formed in the first inorganic encapsulation layer 310 and the second inorganic encapsulation layer 330, so that a neutral plane is formed according to positions of the wires WL. The recess pattern RP may be formed by removing portions of the first inorganic encapsulation layer 310 and the second inorganic encapsulation layer 330 from an edge portion of the bridge area 102.

The recess pattern RP may be arranged at an edge of the bridge area 102. In such an embodiment, the recess pattern RP may be arranged at the edge of the bridge area 102, which does not overlap the wires WL. Since the wires WL having a large modulus are not arranged at the edge of the bridge area 102, a position of a neutral plane at the edge of the bridge area 102 may be different from a position of a neutral plane at a central portion of the bridge area 102.

In such an embodiment, as the recess pattern RP is formed, a neutral plane may be equally formed at the central portion and edge of the bridge area 102, and accordingly, stress that may be applied to the wires WL may be reduced.

Figure 15:
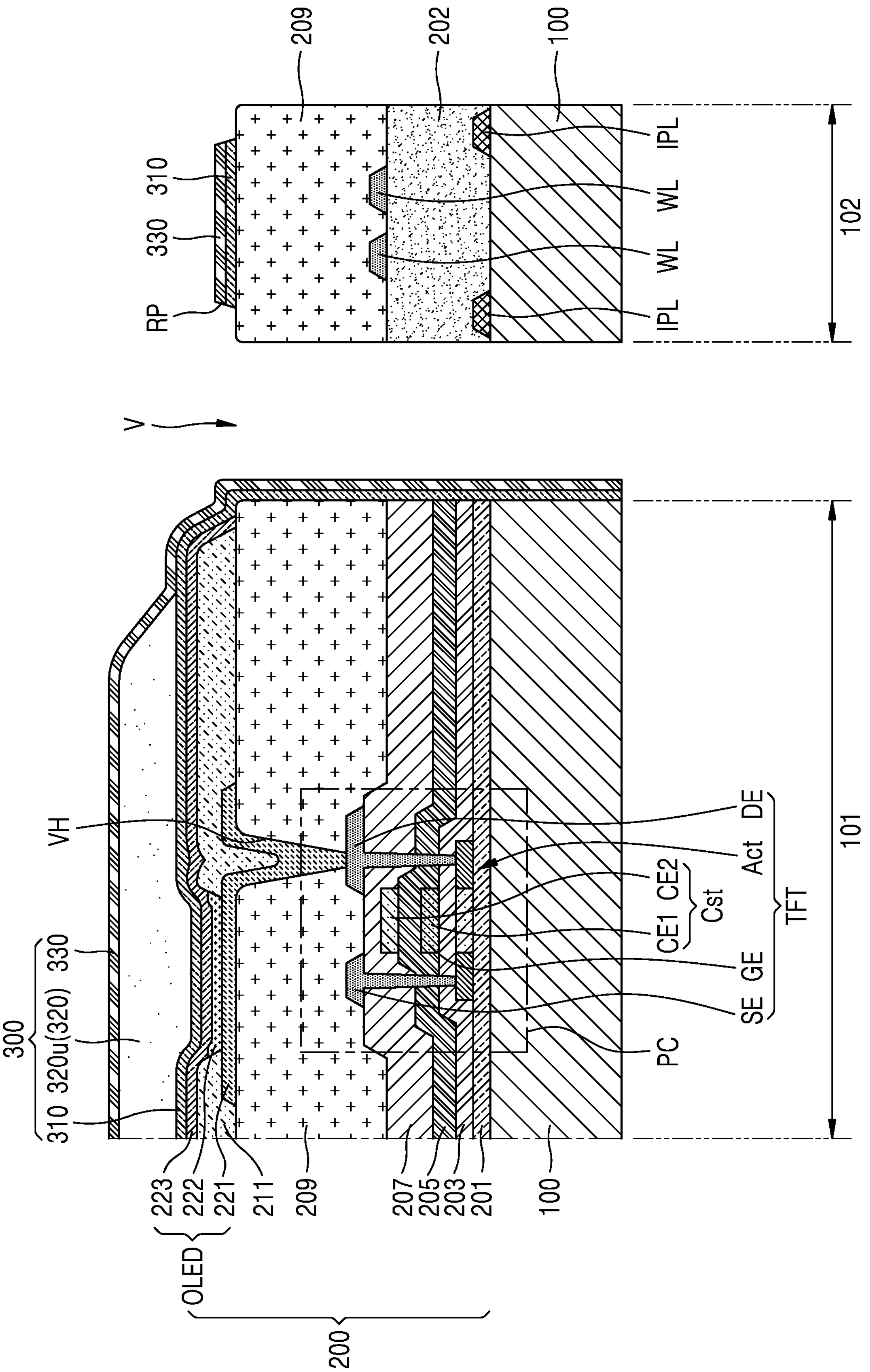
FIG. 15 is a schematic cross-sectional view of a portion of a display apparatus according to another embodiment.

FIG. 15 is a schematic cross-sectional view of a portion of a display apparatus according to another embodiment.

Referring to FIG. 15, the display apparatus may include a first member (not shown), a first adhesive member (not shown), a support member (not shown), a display panel, a second adhesive member (not shown), a second member (not shown), and a stopper unit (not shown). In such an embodiment, the first member, the first adhesive member, the support member, the display panel, the second adhesive member, the second member, and the stopper unit are similar to those described with reference to FIG. 3, and thus any repetitive detailed descriptions thereof will be omitted.

The display panel may include the plurality of display areas 101 and the plurality of bridge areas 102. The display panel includes the substrate 100, the unit display unit 200 including the planarization layer 209, and the encapsulation layer 300 sealing each unit display unit 200. In such an embodiment, the substrate 100, the unit display unit 200 including the planarization layer 209, and the encapsulation layer 300 sealing each unit display unit 200 are the same as or similar to those described with reference to FIG. 5, and thus any repetitive detailed descriptions thereof will be omitted. Hereinafter, for convenience of description, different features from those described with reference to FIG. 5 will be mainly described in detail.

The first inorganic encapsulation layer 310 and the second inorganic encapsulation layer 330 may entirely cover the wires WL. The first inorganic encapsulation layer 310 and the second inorganic encapsulation layer 330 may include the recess pattern RP formed by removing portions of the first inorganic encapsulation layer 310 and the second inorganic encapsulation layer 330 from an edge of the bridge area 102. The recess pattern RP may be arranged at an edge of a long side of the bridge area 102.

The recess pattern RP may include a plurality of sub-recesses apart from each other along the edge of the long side of the bridge area 102. At least one of the plurality of sub-recesses may be arranged at a center of the long side of the bridge area 102. However, the disclosure is not limited thereto. Alternatively, a single recess pattern RP may be provided, or the recess pattern RP may have various shapes, for example, may be formed to entirely expose the edge of the bridge area 102.

Figure 16A:
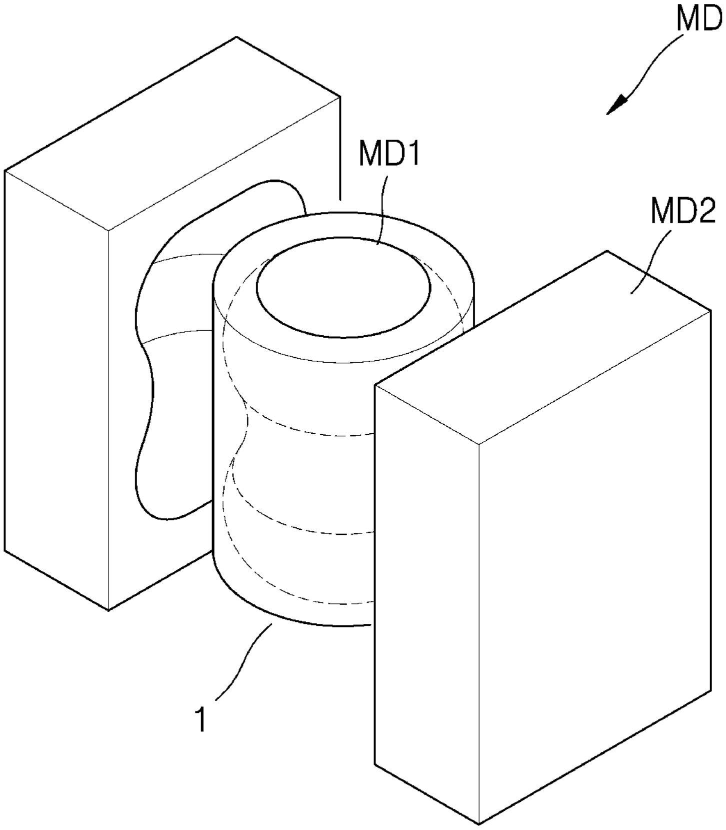
FIG. 16A is a schematic perspective view of a display apparatus manufacturing apparatus for manufacturing a display apparatus according to embodiments.
Figure 16B:
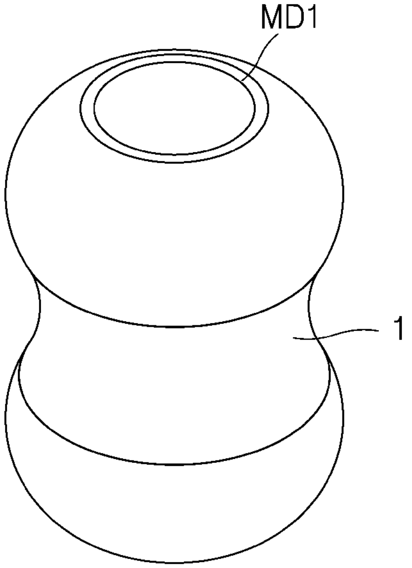
FIG. 16B is a perspective view of a display apparatus manufactured via the display apparatus manufacturing apparatus of FIG. 16A and a first mold.

FIG. 16A is a schematic perspective view of a display apparatus manufacturing apparatus for manufacturing a display apparatus according to embodiments. FIG. 16B is a perspective view of a display apparatus manufactured via the display apparatus manufacturing apparatus of FIG. 16A and a first mold.

Referring to FIGS. 16A and 16B, an embodiment of a display apparatus manufacturing apparatus MD may include a first mold MD1. The display apparatus manufacturing apparatus MD may also include a second mold MD2. In an embodiment, a surface of the first mold MD1 may include an embossed shape or an intaglio shape. However, hereinafter, for convenience of description, embodiments where an outer surface of the first mold MD1 has a shape, such as a bottle, and the second mold MD2 includes a groove having a shape similar to that of the outer surface of the first mold MD1 will be mainly described in detail.

In such an embodiment, after the display apparatus 1 is disposed on the outer surface of the first mold MD1, the first mold MD1 and the second mold MD2 are combined with each other, and heat may be applied thereto. In an embodiment, at least one selected from the first mold MD1 and the second mold MD2 may maintain a surface temperature of not more than 80 degrees Celsius.

In such an embodiment, a shape of the display apparatus 1 may change while the display apparatus 1 contracts along the outer surface of the first mold MD1. In an embodiment, the display apparatus 1 may have a portion that contracts only in a first direction, a portion that contracts only in a second direction, and/or a portion that contracts in both the first direction and the second direction according to a shape of the outer surface of the first mold MD1. In this case, the structure described above may be arranged to prevent rotation of a display area (not shown) when each portion of the display apparatus 1 is deformed. In an embodiment, a stopper unit (not shown), a force applicator (not shown), and an island area, which are described above, may be individually arranged, or a combination thereof may be arranged.

After the display apparatus 1 whose shape is changed is separated from the first mold MD1, the display apparatus 1 whose shape is changed may be disposed on a surface of an object having an appearance similar to that of the first mold MD1. In an embodiment, although the drawing illustrates that the bottle-shaped display apparatus 1 is manufactured, the disclosure is not limited thereto, and as described above, the display apparatus 1 may be arranged in various electronic devices or wearable devices. In addition, the display apparatus 1 may also be used in a monitor, a television (TV), a mobile phone, or the like by being manufactured in a flat state and contracting in a flat state to increase resolution.

A display apparatus according to embodiments may provide a clear image. The display apparatus according to embodiments may reduce rotation of each display area. The display apparatus according to embodiments is not only capable of representing an image to the outside while maintaining a three-dimensional shape, but also makes it possible to see external scenery or the appearance of an object through the display apparatus.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:

a first member;

a display panel disposed on the first member and comprising a plurality of display areas arranged to be apart from each other and a bridge area connecting together the plurality of display areas apart from each other;

a support member disposed on the first member to correspond to each of the plurality of display areas and a portion of the bridge area; and a stopper unit disposed on the first member, wherein the stopper unit selectively contacts with the support member.

2. The display apparatus of claim 1, wherein at least a portion of the stopper unit is bent.

3. The display apparatus of claim 1, wherein the support member and the stopper unit comprise a same material as each other.

4. The display apparatus of claim 1, wherein the support member comprises:

a body portion arranged to correspond to a display area of the plurality of display areas; and a protrusion portion protruding from the body portion.

5. The display apparatus of claim 4, wherein the stopper unit selectively contacts with the protrusion portion.

6. The display apparatus of claim 1, wherein the stopper unit comprises:

a first stopper unit; and a second stopper unit arranged to be apart from the first stopper unit and arranged in a direction opposite to the first stopper unit with respect to a center of a display area of the plurality of display areas.

7. The display apparatus of claim 1, further comprising:

a first adhesive member arranged between the first member and the support member and between the first member and the stopper unit.

8. The display apparatus of claim 1, further comprising:

a second member disposed on the display panel.

9. The display apparatus of claim 8, further comprising:

a second adhesive member arranged between the second member and the display panel and disposed to correspond to each of the plurality of display areas and the bridge area.

10. The display apparatus of claim 9, further comprising:

a force applicator protruding from the second adhesive member and in contact with the bridge area.

11. The display apparatus of claim 8, wherein the second member comprises a heat-shrinkable film.

12. The display apparatus of claim 8, wherein the first member and the second member comprise a same material as each other, and a thickness of the first member is greater than a thickness of the second member.

13. The display apparatus of claim 1, wherein the first member comprises a heat-shrinkable film.

14. A display apparatus comprising:

a first member;

a display panel disposed on the first member and comprising a plurality of display areas arranged to be apart from each other and a bridge area connecting together the plurality of display areas apart from each other;

a support member disposed on the first member to correspond to each of the plurality of display areas and a portion of the bridge area;

a second member disposed on the display panel;

a second adhesive member arranged between the second member and the display panel and having a planar shape corresponding to a planar shape of each of the plurality of display areas and a planar shape of the bridge area; and a force applicator protruding from the second adhesive member to the bridge area and in contact with the bridge area.

15. The display apparatus of claim 14, wherein the force applicator is in contact with a center of the bridge area.

16. The display apparatus of claim 14, wherein the force applicator applies a force to the bridge area toward the first member when display areas adjacent to each other among the plurality of display areas come closer to each other.

17. The display apparatus of claim 14, wherein the support member comprises:

a body portion arranged to correspond to a display area of the plurality of display areas; and a protrusion portion protruding from the body portion.

18. The display apparatus of claim 14, wherein the first member and the second member comprise a same material as each other.

19. The display apparatus of claim 14, wherein at least one selected from the first member and the second member comprises a heat-shrinkable film.

20. The display apparatus of claim 14, wherein a thickness of the first member and a thickness of the second member are different from each other.

21. The display apparatus of claim 14, further comprising:

a first adhesive member arranged between the first member and the support member.

22. A display apparatus comprising:

a first member;

a display panel disposed on the first member and comprising a plurality of display areas arranged to be apart from each other and a bridge area connecting together the plurality of display areas apart from each other;

a support member disposed on the first member to correspond to each of the plurality of display areas and a portion of the bridge area; and a first adhesive member arranged between the first member and the support member and comprising an island area arranged to overlap at least a portion of the support member in a plan view and having a modulus of elasticity greater than a modulus of elasticity of an area excluding the island area of the first adhesive member.

23. The display apparatus of claim 22, wherein the island area comprises:

a first island area corresponding to a display area of the plurality of display areas; and a second island area protruding from the first island area and overlapping at least a portion of the bridge area.

24. The display apparatus of claim 23, wherein a length of the second island area is smaller than a length of the bridge area in a plan view.

25. The display apparatus of claim 23, wherein the second island area comprises a plurality of second island areas, and one of the plurality of second island areas and another one of the plurality of second island areas protrude from the first island area in different directions from each other.

26. The display apparatus of claim 22, wherein the support member is arranged inside the island area.

27. The display apparatus of claim 22, wherein an adhesion of the island area to the support member is greater than or equal to 3,000 g·f/inch.

28. The display apparatus of claim 22, wherein an adhesion of the island area to the support member is greater than an adhesion of the area of the first adhesive member excluding the island area to the support member.

29. The display apparatus of claim 22, wherein the first adhesive member further comprises a core portion arranged in the island area.

30. The display apparatus of claim 22, further comprising:

a second member disposed on the display panel.

31. The display apparatus of claim 30, wherein a thickness of the first member and a thickness of the second member are different from each other.

32. The display apparatus of claim 30, wherein the first member and the second member comprise a same material as each other.

33. The display apparatus of claim 30, further comprising:

a second adhesive member arranged between the second member and the display panel and disposed to correspond to each of the plurality of display areas and at least a portion of the bridge area.

34. The display apparatus of claim 22, wherein the first member comprises a heat-shrinkable film.

* * * * *